US011605891B2

(12) United States Patent
Park et al.

(10) Patent No.: US 11,605,891 B2
(45) Date of Patent: Mar. 14, 2023

(54) CIRCUIT BOARD INCLUDING INSULATING LAYER HAVING A PLURALITY OF DIELECTRICS WITH DIFFERENT DIELECTRIC LOSS, AND ELECTRONIC DEVICE INCLUDING THE CIRCUIT BOARD

(71) Applicant: Samsung Electronics Co., Ltd., Suwon-si (KR)

(72) Inventors: Sungwon Park, Suwon-si (KR); Dongil Son, Suwon-si (KR); Sangwon Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 375 days.

(21) Appl. No.: 16/460,937

(22) Filed: Jul. 2, 2019

(65) Prior Publication Data
US 2020/0006853 A1    Jan. 2, 2020

(30) Foreign Application Priority Data

Jul. 2, 2018 (KR) .................. 10-2018-0076370

(51) Int. Cl.
*H01Q 9/04* (2006.01)
*H05K 1/02* (2006.01)
*H05K 1/11* (2006.01)

(52) U.S. Cl.
CPC .......... *H01Q 9/0407* (2013.01); *H05K 1/024* (2013.01); *H05K 1/0277* (2013.01); *H05K 1/0298* (2013.01); *H05K 1/115* (2013.01)

(58) Field of Classification Search
CPC .... H01Q 9/0407; H01Q 1/243; H01Q 1/2283; H01Q 9/0414; H01Q 21/28;
(Continued)

(56) References Cited

U.S. PATENT DOCUMENTS 5,861,848 A * 1/1999 Iwasaki ................ H01Q 9/0428
343/700 MS
6,908,960 B2 6/2005 Takaya et al.
(Continued)

FOREIGN PATENT DOCUMENTS

CN    102638929 A    8/2012
EP    3667716 A1    6/2020
(Continued)

OTHER PUBLICATIONS

European Patent Office, "Supplementary European Search Report" dated Mar. 24, 2021, in connection with European Patent Application No. 19831151.6, 15 pages.
(Continued)

*Primary Examiner* — Dimary S Lopez Cruz
*Assistant Examiner* — Michael M Bouizza

(57) ABSTRACT

An electronic device includes a communication circuit electrically connected with a circuit board. The circuit board includes a first portion comprising a first layered structure in which a wiring layer and a first insulating layer are alternately positioned, and a second portion comprising a second layered structure in which the wiring layer and the first insulating layer are alternately positioned and a second insulating layer. At least one antenna patch is positioned on or within the second insulating layer. A conductive line penetrates the second layered structure and the second insulating layer and electrically connects the at least one antenna patch and the communication circuit. The first insulating layer has a first loss tangent value, and the second insulating layer has a second loss tangent value smaller than the first loss tangent value.

15 Claims, 20 Drawing Sheets

(58) Field of Classification Search
CPC ...... H01Q 21/065; H05K 1/024; H05K 1/115; H05K 1/0277; H05K 1/0298; H05K 2201/0187; H05K 1/165; H04M 1/0277
See application file for complete search history.

(56) References Cited

U.S. PATENT DOCUMENTS

| | | | |
|---|---|---|---|
| 8,187,696 | B2 | 5/2012 | Paul et al. |
| 8,218,337 | B2 | 7/2012 | Choudhury et al. |
| 9,196,951 | B2 | 11/2015 | Baks et al. |
| 10,285,269 | B2 | 5/2019 | Yosui |
| 2002/0132898 | A1 | 9/2002 | Takaya et al. |
| 2003/0189246 | A1 | 10/2003 | Iwaki et al. |
| 2005/0130446 | A1 | 6/2005 | Takaya et al. |
| 2005/0130447 | A1 | 6/2005 | Takaya et al. |
| 2005/0154110 | A1 | 7/2005 | Takaya et al. |
| 2009/0315797 | A1 | 12/2009 | Rofougaran et al. |
| 2010/0015404 | A1 | 1/2010 | Paul et al. |
| 2011/0149519 | A1 | 6/2011 | Choudhury et al. |
| 2012/0205141 | A1 | 8/2012 | Ogawa et al. |
| 2014/0145883 | A1 | 5/2014 | Baks et al. |
| 2015/0016078 | A1 | 1/2015 | Yang et al. |
| 2015/0126684 | A1 | 5/2015 | Das et al. |
| 2015/0382464 | A1 | 12/2015 | Yosui |
| 2016/0249451 | A1 | 8/2016 | Das et al. |
| 2016/0360614 | A1 | 12/2016 | Das et al. |
| 2019/0045630 | A1 | 2/2019 | Kim et al. |
| 2019/0089044 | A1 | 3/2019 | Kobuke et al. |
| 2020/0170112 | A1 | 5/2020 | Matsumaru |

FOREIGN PATENT DOCUMENTS

| | | |
|---|---|---|
| JP | H08-97564 A | 4/1996 |
| JP | 2007-096159 A | 4/2007 |
| JP | 2008-117846 A | 5/2008 |
| KR | 10-2008-0001353 A | 1/2008 |
| KR | 10-2016-0084421 A | 7/2016 |
| KR | 10-2017-0100752 A | 9/2017 |
| WO | 2015033705 A1 | 3/2015 |
| WO | 2017173350 A1 | 10/2017 |

OTHER PUBLICATIONS

International Search Report dated Oct. 25, 2019 in connection with International Patent Application No. PCT/KR2019/007659, 3 pages.
Written Opinion of the International Searching Authority dated Oct. 25, 2019 in connection with International Patent Application No. PCT/KR2019/007659, 5 pages.
Office Action dated Sep. 21, 2022 in connection with European Patent Application No. 19 831 151.6, 14 pages.
Office Action dated Dec. 21, 2022 in connection with Chinese Patent Application No. 201980040353.5, 20 pages.
Request for the Submission of an Opinion dated Jan. 1, 2023 in connection with Korean Patent Application No. 10-2018-0076370, 15 pages.

* cited by examiner

CIRCUIT BOARD INCLUDING INSULATING LAYER HAVING A PLURALITY OF DIELECTRICS WITH DIFFERENT DIELECTRIC LOSS, AND ELECTRONIC DEVICE INCLUDING THE CIRCUIT BOARD

CROSS-REFERENCE TO RELATED APPLICATION(S)

This application is based on and claims priority under 35 U.S.C. § 119 to Korean Patent Application No. 10-2018-0076370, filed on Jul. 2, 2018, in the Korean Intellectual Property Office, the disclosure of which is incorporated by reference herein its entirety.

BACKGROUND

1. Field

The disclosure relates to a technology for applying an insulating layer that makes it possible to improve a loss characteristic in an antenna structure transferring a radio frequency (RF) signal.

2. Description of Related Art

An electronic device (e.g., a smartphone or a wearable device) that supports wireless communication transmits/receives a radio frequency (RF) signal. The electronic device transfers an RF signal received through an antenna patch to a radio frequency integrated circuit (RFIC) by using a printed circuit board (PCB) or a flexible printed circuit board (FPCB). The RFIC transfers the RF signal to a processor.

The PCB or FPCB have a layered structure in which a wiring layer and an insulating layer are alternately positioned. In the layered structure, an insulating layer is interposed between wiring layers and separates different wiring layers from each other. The insulating layer prevents a short circuit between different wiring layers.

A dielectric material forming an insulating layer has a loss tangent (tanδ) value. The loss tangent value is a value that is obtained by inputting a ratio of a real part to an imaginary part of a complex dielectric constant to a tangent function. As a loss tangent value of a dielectric material forming an insulating layer decreases, costs for the insulating layer increase. A loss tangent value of a general dielectric material forming an insulating layer is 0.02 or more and 0.03 or less.

The above information is presented as background information only to assist with an understanding of the disclosure. No determination has been made, and no assertion is made, as to whether any of the above might be applicable as prior art with regard to the disclosure.

SUMMARY

An antenna patch may transmit/receive an RF signal by using a specified frequency band. A PCB or FPCB that is connected with the antenna patch may form an antenna structure transferring an RF signal. In detail, the PCB may form a general board or may form an antenna structure. Also, in the case where there are a PCB forming a general board and a PCB forming an antenna structure, an FPCB connecting the antenna structure and the PCB may be provided. An insulating layer may be included in the PCB or the FPCB. A loss of an RF signal according to a loss tangent value of the insulating layer may occur in the PCB or FPCB. In the case where a frequency of an RF signal increases, the loss of the RF signal occurring in the insulating layer may increase.

In the case where an insulating layer that is formed of a dielectric material having a loss tangent value of 0.02 or more and 0.03 or less is applied to the PCB or FPCB, there is an issue that a line loss of an RF signal increases in an electronic device using a high frequency band.

In accordance with an aspect of the disclosure, an electronic device may include a communication circuit, and a circuit board electrically connected with the communication circuit. The circuit board may include a first portion and a second portion. The first portion may include a first layered structure in which a wiring layer and a first insulating layer are alternately positioned from a first surface to a second surface facing away from the first surface, and the second portion may include a second layered structure in which the wiring layer and the first insulating layer are alternately positioned from the first surface to a first layer provided between the first surface and the second surface, and a second insulating layer that is positioned on the first layer up to the second surface and forms a portion of the second surface. At least one antenna patch may be positioned on the second insulating layer or within the second insulating layer, a conductive line that penetrates the second layered structure and at least a portion of the second insulating layer and electrically connects the at least one antenna patch and the communication circuit may be formed, and the first insulating layer may have a first loss tangent value, and the second insulating layer may have a second loss tangent value smaller than the first loss tangent value.

In accordance with another aspect of the disclosure, an antenna structure may include a communication circuit, and a circuit board. The circuit board may include a first conductive layer, a second conductive layer that is positioned below the first conductive layer, a first insulating layer that is between the first conductive layer and the second conductive layer and includes a first dielectric having a first dielectric loss, wherein at least one antenna and the communication circuit electrically connected with the antenna through at least one wiring are positioned in a specified area, a third conductive layer that is positioned below the second conductive layer, and a second insulating layer that is between the second conductive layer and the third conductive layer and in the specified area. A second dielectric having a second dielectric loss smaller than the first dielectric loss may be formed in the second insulating layer.

In accordance with another aspect of the disclosure, an electronic device may include an antenna structure, and an IFIC that is connected with the antenna structure through a connection wiring. The antenna structure may include a printed circuit board (PCB), a flexible printed circuit board (FPCB) that is connected with one side of the PCB, and at least one radio frequency (RF) wiring that is positioned on a surface of the FPCB. The FPCB may include at least one wiring layer, a first flexible layer that is positioned between the at least one wiring layer, and a second flexible layer that is positioned between the at least one wiring layer. The first flexible layer may have a first loss tangent value, and the second flexible layer may be a second loss tangent value smaller than the first loss tangent value.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to accompanying drawings. However, those of ordinary skill in the art will recognize that modification, equivalent, and/or alternative on various embodiments described herein can be variously made without departing from the scope and spirit of the disclosure.

Figure 1:
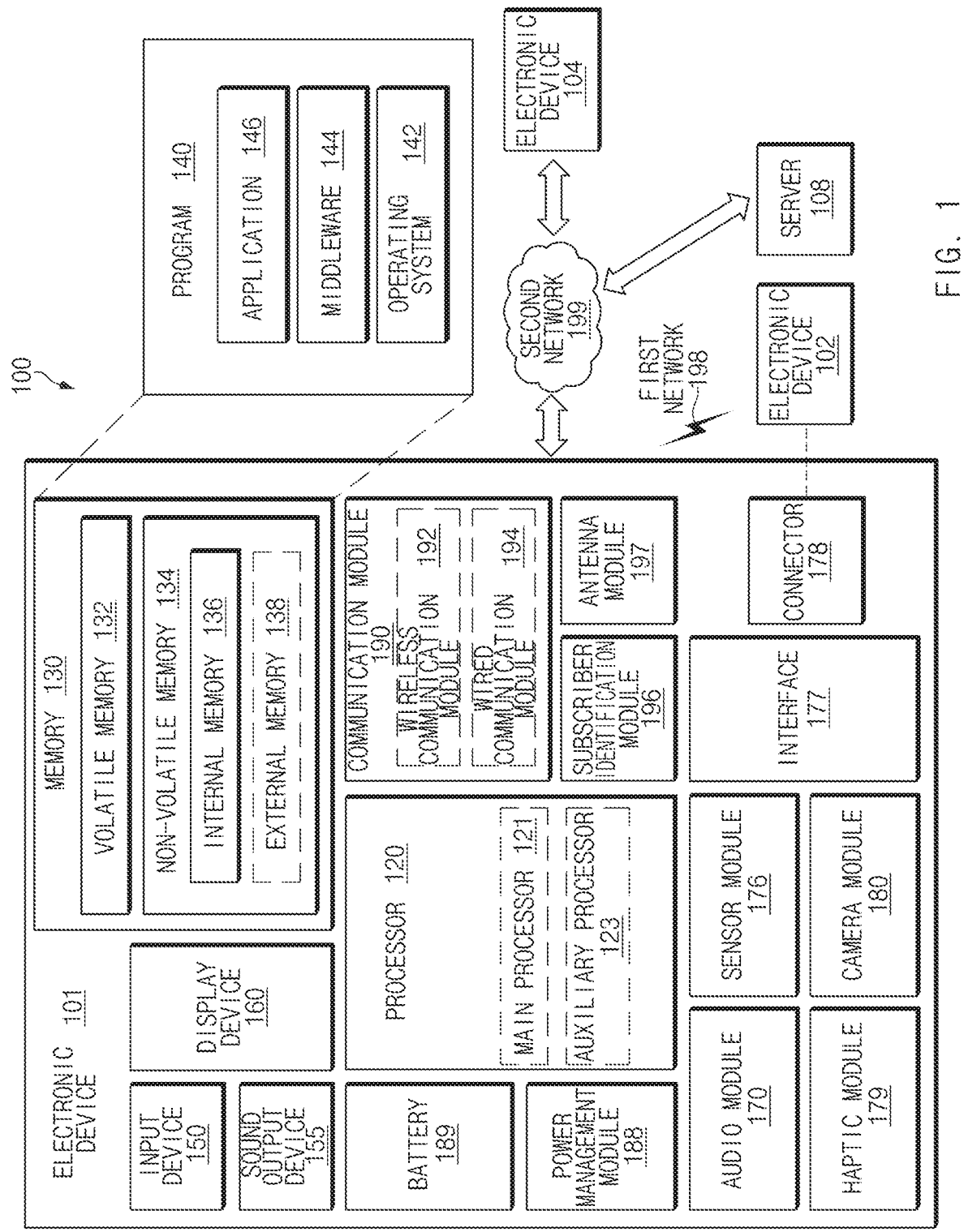
FIG. 1 illustrates a block diagram of an electronic device in a network environment according to various embodiments.

FIG. 1 illustrates a block diagram of an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
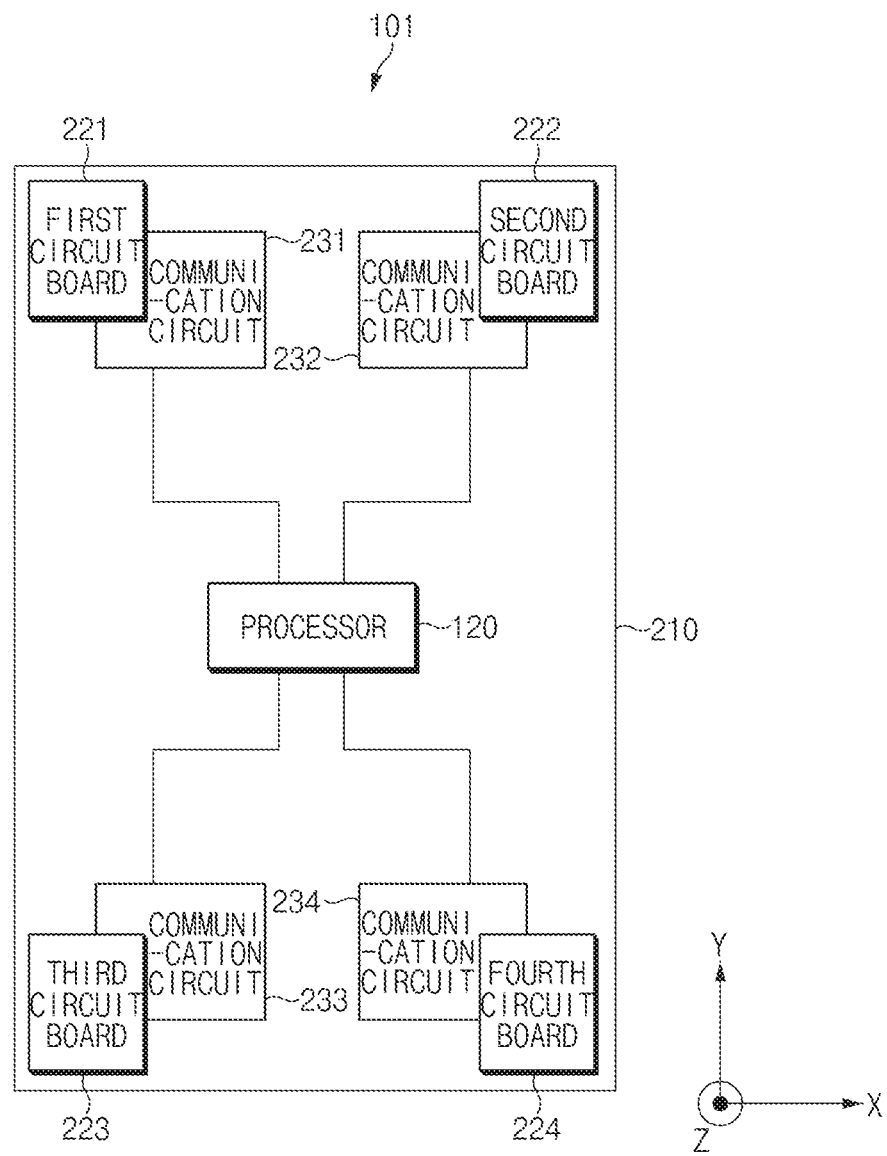
FIG. 2 illustrates a diagram of an electronic device supporting 5G communication according to an embodiment.

FIG. 2 illustrates a diagram of the electronic device 101 supporting 5G communication, according to an embodiment.

In an embodiment, the electronic device 101 (e.g., the electronic device 101 of FIG. 1) of FIG. 2 may include a cover 210, the processor 120 (e.g., the processor 120 of FIG. 1), circuit boards 221 to 224, communication circuits 231 to 234 (e.g., the communication module 190 of FIG. 1) respectively corresponding to the circuit boards 221 to 224.

In an embodiment, the cover 210 may protect any other components of the electronic device 101. The cover 210 may form a front surface, a back surface, and a side surface of the electronic device 101. For example, the cover 210 may include a front plate, a back plate facing away from the front plate, and a side member (or a metal frame) surrounding a space between the front plate and the back plate. The side member may be attached to the back plate or may be integrally formed with the back plate. The cover 210 may be positioned parallel to an XY plane being a plane defined by an X-axis and a Y-axis.

In an embodiment, the processor 120 may include at least one of a central processing unit (CPU), an application processor (AP), a graphic processing unit (GPU), and an image signal processor (ISP) of a camera. According to an embodiment, the processor 120 may be implemented with a system on chip (SoC) or a system in package (SiP).

In an embodiment, the electronic device 101 may include the circuit boards 221 to 224. The circuit boards 221 to 224 may be positioned within the cover 210. For example, the first circuit board 221, the second circuit board 222, the third circuit board 223, and the fourth circuit board 224 may be positioned within the cover 210. The circuit boards 221 to 224 may be a printed circuit board (PCB) or a flexible printed circuit board (FPCB). The circuit boards 221 to 224 may include an antenna transmitting/receiving a radio frequency (RF) signal.

In an embodiment, positions of the circuit boards 221 to 224 of FIG. 2 and the number of the circuit boards 221 to 224 of FIG. 2 may be exemplary. Each of the circuit boards 221 to 224 may be positioned in an edge area of one side of the electronic device 101. However, the disclosure is not limited thereto. For example, the circuit boards 221 to 224 may be positioned within the electronic device 101. Also, the circuit boards 221 to 224 may include four or more circuit boards or three or less circuit boards.

In an embodiment, the communication circuits 231 to 234 respectively corresponding to the circuit boards 221 to 224 may be positioned on first surfaces of the circuit boards 221 to 224. The communication circuits 231 to 234 may be positioned on the first surface of the circuit boards 221 to 224 in a 1:1 correspondence. The communication circuits 231 to 234 may be a radio frequency integrated circuit (RFIC). The first surface may be one surface of each of the circuit boards 221 to 224, which are provided in a Z-axis direction. For example, the first surface may be a lower (or back) surface of each of the circuit boards 221 to 224 with respect to the Z-axis direction. However, the disclosure is not limited thereto. For example, the communication circuits 231 to 234 may be respectively connected with the circuit boards 221 to 224 through wirings.

In an embodiment, an antenna included in each of the circuit boards 221 to 224 may be positioned on a second surface of each of the circuit boards 221 to 224. The antenna may be formed on at least a partial area of each of the circuit boards 221 to 224.

In an embodiment, the processor 120 may further include a band processor (BP). The BP may form one module with the processor 120. For example, the BP may be integrally formed with the processor 120. For another example, the BP may be positioned within one chip or may be implemented in the form of an independent chip. According to an embodiment, the processor 120 and at least one BP (e.g., a first BP) may be integrally formed within one chip (e.g., a SoC), and any other BP (e.g., a second BP) may be implemented in the form of an independent chip.

In an embodiment, each of the communication circuits 231 to 234 may further include the BP. The electronic device 101 may further include one or more interfaces for supporting inter-chip communication between the BP and the processor 120. For example, the processor 120 and the BP may transmit/receive data by using an inter-chip interface (e.g., an inter processor communication channel).

In an embodiment, the first BP or the second BP may provide an interface for performing communication with any other entities. The first BP may support, for example, wireless communication with regard to a first network (e.g., the first network 198 of FIG. 1). The second BP may support, for example, wireless communication with regard to a second network (e.g., the second network 199 of FIG. 2).

In an embodiment, the first network may include a $4^{th}$ generation (4G) network. The second network may include a $5^{th}$ generation (5G) network. The 4G network may support, for example, a long term evolution (LTE) protocol defined in the 3GPP. The 4G network may support a frequency band ranging from about 10 MHz to about 850 MHz, and may support a frequency band ranging from about 10 MHz to about 1.8 GHz. The 5G network may support, for example, a new radio (NR) protocol defined in the 3GPP. The 5G network may support a frequency band ranging from about 300 MHz to about 3.5 GHz, and may support a frequency band ranging from about 1 GHz to about 28 GHz.

Figure 3A:
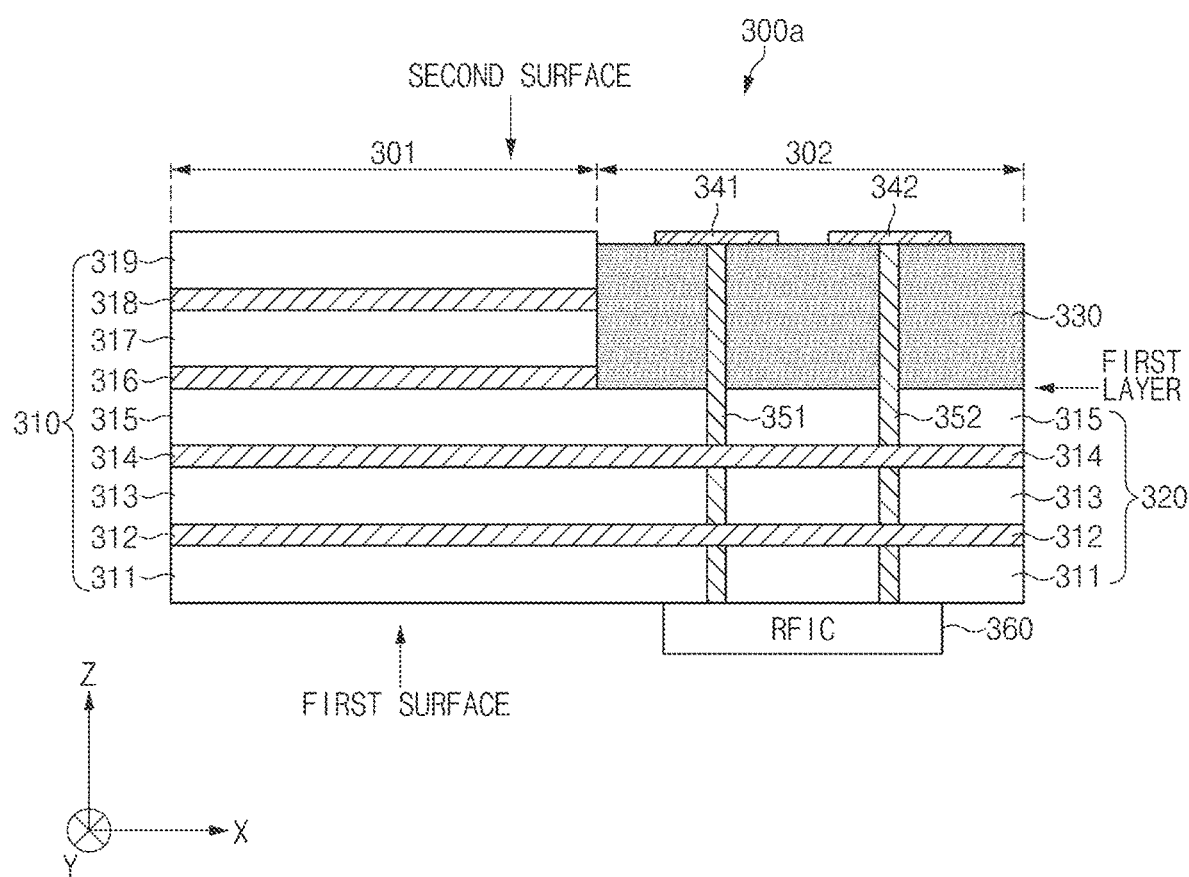
FIGS. 3A and 3B illustrate diagrams of an antenna structure and a radio frequency integrated circuit (RFIC) according to another embodiment.
Figure 3B:
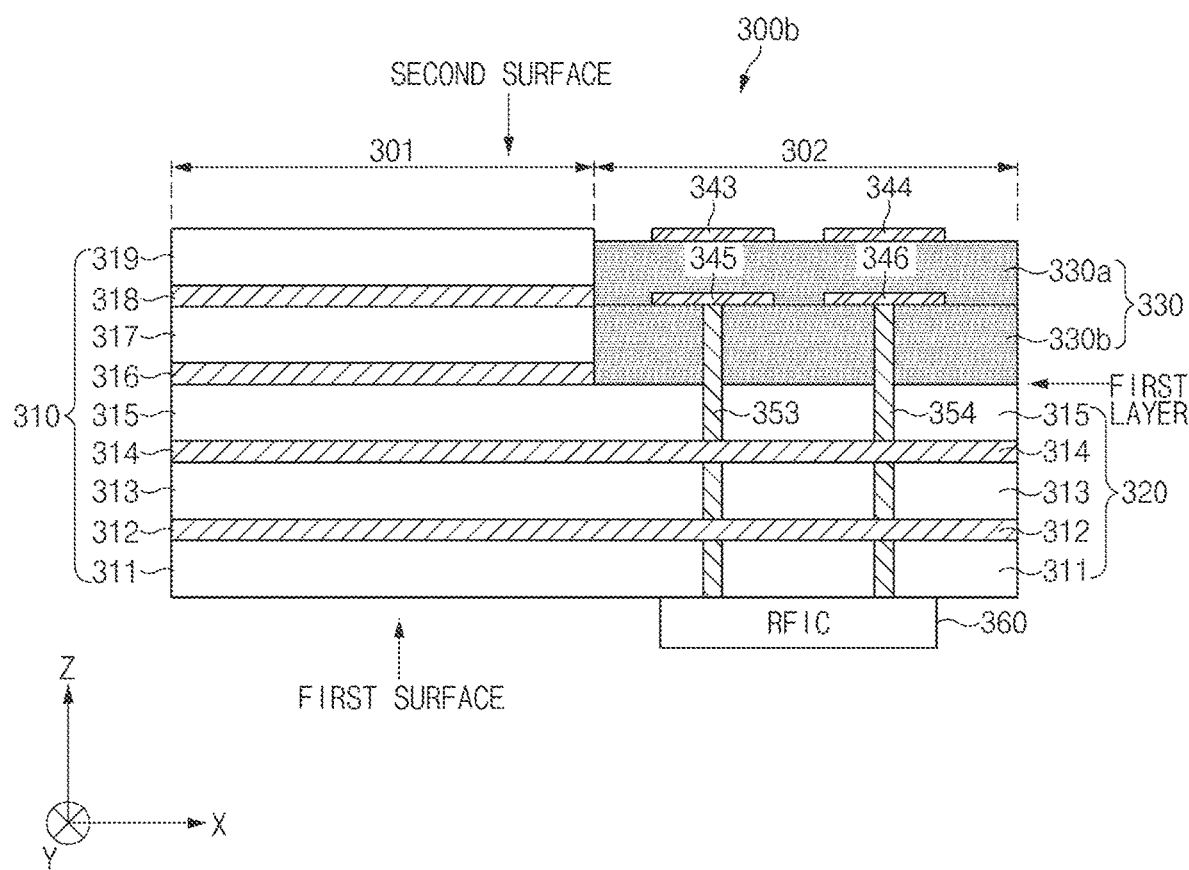

FIG. 3A illustrates a diagram of an antenna structure 300a and an RFIC 360 according to an embodiment. FIG. 3B illustrates a diagram of an antenna structure 300b and an RFIC 360 according to another embodiment. The antenna structures 300a and 300b of FIGS. 3A and 3B may perform substantially the same function and role as any one of the circuit boards 221 to 224 (refer to FIG. 2) each including an antenna. The RFIC 360 of FIGS. 3A and 3B may perform substantially the same function and role as any one of the communication circuits 231 to 234 of FIG. 2. Each of the antenna structures 300a and 300b according to various embodiments may include a first portion 301 and a second portion 302.

In an embodiment, in each of the antenna structures 300a and 300b, the first portion 301 may have a first layered structure 310 in which wiring layers 312, 314, 316, and 318 and first insulating layers 311, 313, 315, 317, and 319 are alternately positioned between a first surface and a second surface of each of the antenna structures 300a and 300b, and the second surface may face away from (or may be opposite to) the first surface. The first surface may be a lower surface of each of the antenna structures 300a and 300b with respect to the Z-axis direction. The second surface may be an upper surface of each of the antenna structures 300a and 300b with respect to the Z-axis direction.

In an embodiment, the wiring layers 312, 314, 316, and 318 and the first insulating layers 311, 313, 315, 317, and 319 may be alternately stacked in the first layered structure 310. As illustrated in FIGS. 3A and 3B, the five first insulating layers 311, 313, 315, 317, and 319 and the four wiring layers 312, 314, 316, and 318 may be alternately stacked. However, the disclosure is not limited thereto. For example, in the first layered structure 310, the number of the wiring layers 312, 314, 316, and 318 and the number of the first insulating layers 311, 313, 315, 317, and 319 may be variously changed.

In an embodiment, each of the wiring layers 312, 314, 316, and 318 may include at least one conductive line. The at least one conductive line may be formed on an XY plane along a surface of each of the wiring layers 312, 314, 316, and 318. The at least one conductive line may be formed in each of the wiring layers 312, 314, 316, and 318. The at least one conductive line may transfer various signals and voltages generated in a wiring layer 312, 314, 316, or 318 to any other wiring layer 312, 314, 316, or 318. The at least one conductive line may be formed of metal (e.g., copper or silver).

In an embodiment, as illustrated in FIG. 3A, the second portion 302 may include a second layered structure 320, a second insulating layer 330, at least one or more antenna patches 341 and 342, and conductive lines 351 and 352. In another embodiment, as illustrated in FIG. 3B, the second portion 302 may include the second layered structure 320, the second insulating layer 330, at least one or more antenna patches 343 to 346, and conductive lines 353 and 354.

In an embodiment, the wiring layers 312 and 314 and the first insulating layers 311, 313, and 315 are alternately positioned in the second layered structure 320 from the first surface (e.g., a lower surface of an antenna structure 300a or 300b with respect to the Z-axis direction) to a first layer. The second layered structure 320 may be formed in the same stacked structure as a lower portion of a first layer 315 of the first layered structure 310. The first layer may be a layer between the first surface and the second surface (e.g., an upper surface of the antenna structure 300a or 300b with respect to the Z-axis direction). For example, in FIGS. 3A and 3B, the first layer may be the first insulating layer 315 positioned in an intermediate layer with respect to a Z-axis.

In an embodiment, a structure from the first surface of the first layered structure 310 to the first layer 315 and the second layered structure 320 may have the same stacked structure. The first layered structure 310 and the second layered structure 320 from the first surface to the first layer 315 may have the same structure in which the wiring layers 312 and 314 and the first insulating layers 311, 313, and 315 are positioned. As such, the first layered structure 310 and the second layered structure 320 may be simultaneously formed from the first surface to the first layer 315.

In an embodiment, the second insulating layer 330 may be positioned on the first layer 315, may extend to the second surface, and may form a portion of the second surface. A height of an upper surface of the second insulating layer 330 may be lower than a height of an upper surface of the first layered structure 310. However, the disclosure is not limited thereto. For example, the height of the upper surface of the second insulating layer 330 may be the same as or higher than the height of the upper surface of the first layered structure 310.

In an embodiment, as illustrated in FIG. 3A, the at least one or more antenna patches 341 and 342 may be positioned on the second insulating layer 330. For example, the at least one or more antenna patches 341 and 342 may be positioned on a second surface of the second insulating layer 330. In this case, the second insulating layer 330 may be formed with a single layer from the upper surface of the second insulating layer 330 to lower surfaces of the at least one or more antenna patches 341 and 342. The number of the at least one or more antenna patches 341 and 342 may be more or less than 2. The at least one or more antenna patches 341 and 342 may be in the form of a rectangle or a circle. The at least one or more antenna patches 341 and 342 may be electrically connected with the RFIC 360 and may transmit/receive an RF signal.

In an embodiment, the height of the upper surface of the second insulating layer 330 may be equal to or lower than the height of the upper surface of the first layered structure 310. As such, even though the at least one or more antenna patches 341 and 342 are positioned on the second insulating layer 330, an upper surface of the cover 210 may be prevented from protruding due to the at least one or more antenna patches 341 and 342.

In an embodiment, as illustrated in FIG. 3B, the at least one or more antenna patches 343 to 346 may be positioned on at least a portion of a surface of the second insulating layer 330 and within the second insulating layer 330. For example, the first antenna patches 343 and 344 of the at least one or more antenna patches 343 to 346 may be positioned on the second surface being the upper surface of the second insulating layer 330 and may transmit/receive an RF signal. Also, the second antenna patches 345 and 346 of the at least one or more antenna patches 343 to 346 may be positioned within the second insulating layer 330 and may be electrically connected with the RFIC 360. The coupling may occur between the first antenna patches 343 and 344 and the second antenna patches 345 and 346.

In an embodiment, the at least one or more antenna patches 341 to 346 may be replaced with various kinds of antennas. For example, the at least one or more antenna patches 341 to 346 may be replaced with a patch antenna, a shorted patch antenna, a dipole antenna, a loop antenna, or a slot antenna.

In an embodiment, conductive lines 351 to 354 may penetrate at least a portion of the second layered structure 320. The conductive lines 351 to 354 may penetrate the first insulating layers 311, 313, and 315 of the second layered structure 320. The conductive lines 351 to 354 may be connected with the wiring layers 312 and 314 of the second layered structure 320. For example, the conductive lines 351 to 354 may be connected with the RFIC 360 in a state where at least a partial area of the wiring layers 312 and 314 of the second layered structure 320 is isolated. For another example, the conductive lines 351 to 354 may be connected with at least one or more conductive lines included in the wiring layers 312 and 314.

In an embodiment, as illustrated in FIG. 3A, the conductive lines 351 and 352 may completely penetrate the second insulating layer 330. In the case where the at least one or more antenna patches 341 and 342 are positioned on the second insulating layer 330, the conductive lines 351 and 352 may be connected with lower surfaces of the at least one or more antenna patches 341 and 342. The conductive lines 351 and 352 formed in the second insulating layer 330 may be extended from the lower surfaces of the at least one or more antenna patches 341 and 342 to the first layer 315. The conductive lines 351 and 352 may penetrate the second insulating layer 330 from the first layer 315 to the second surface.

In an embodiment, as illustrated in FIG. 3B, the conductive lines 353 and 354 may penetrate a portion of the second insulating layer 330. In the case where the second antenna patches 345 and 346 are positioned within the second insulating layer 330, the conductive lines 353 and 354 may be connected with lower surfaces of the second antenna patches 345 and 346. The conductive lines 353 and 354 formed in the second insulating layer 330 may be extended from the lower surfaces of the second antenna patches 345 and 346 to the first layer 315. The conductive lines 353 and 354 may penetrate the second insulating layer 330 from the first layer 315 to the second antenna patches 345 and 346.

In an embodiment, the conductive lines 351 to 354 may electrically connect the at least one antenna patch 341, 342, 345, or 346 with the RFIC 360. The conductive lines 351 to 354 may connect the at least one or more antenna patch 341, 342, 345, or 346 with the wiring layers 312 and 314 of the second layered structure 320. The conductive lines 351 to 354 may connect the wiring layers 312 and 314 of the second layered structure 320. The conductive lines 351 to 354 may connect the wiring layers 312 and 314 of the second layered structure 320 with the RFIC 360. For example, the conductive lines 351 to 354 may connect an area isolated from among the wiring layers 312 and 314 with the RFIC 360.

In an embodiment, the first insulating layers 311, 313, 315, 317, and 319 may have a first loss tangent (tan δ) value.

In an embodiment, the second insulating layer 330 may have a second loss tangent value smaller than the first loss tangent value. In the case where the second insulating layer 330 is formed of a low loss tangent (low Df) material, a loss tangent value of which is smaller than that of the first insulating layers 311, 313, 315, 317, and 319, a loss of an RF signal of a high frequency due to the second insulating layer 330 may decrease. As such, there may be improved a loss characteristic of the second insulating layer 330 when an RF signal is transferred from the at least one antenna patches 341 to 346 to the RFIC 360.

According to various embodiments, the electronic device 101 may include a communication circuit (e.g., the RFIC 360) and a circuit board (e.g., the antenna structure 300a or 300b). The circuit board may include a first conductive layer in which at least one antenna (e.g., the antenna patch 341 or 342) is formed in a first area (e.g., a second surface), wherein the communication circuit electrically connected with the at least one antenna through a via hole (e.g., the conductive line 351, 352, 353, or 354) is disposed in a second area (e.g., a first surface) facing away from the first area, a second conductive layer disposed below the first conductive layer, and an insulating layer between the first conductive layer and the second conductive layer and including a first dielectric (e.g., the first insulating layer 311, 313, and 315) having a first dielectric loss and a second dielectric (e.g., the second insulating layer 330) having a second dielectric loss smaller than the first dielectric loss, and the second dielectric may be interposed between the first area and the second area.

Figure 4:
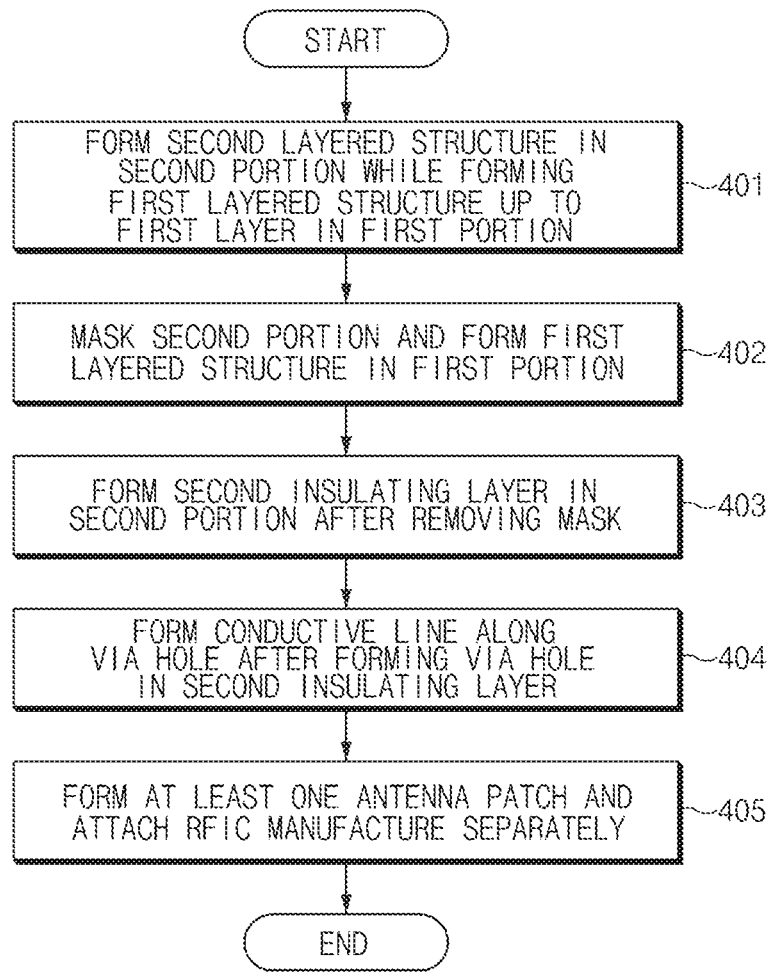
FIG. 4 illustrate a diagram of a process of manufacturing an antenna structure and an RFIC according to an embodiment.

FIG. 4 illustrates a diagram of a process of manufacturing the antenna structure 300a or 300b and the RFIC 360 according to an embodiment.

Process 401 may be an operation of forming the second layered structure 320 in the second portion 302 while forming the first layered structure 310 up to the first layer 315 in the first portion 301 of the antenna structure 300a or 300b according to an embodiment. As such, at least a portion of the first layered structure 310 and the second layered structure 320 may be formed in process 401. In process 401, a lower portion of the first layer 315 of the first layered structure 310 may be formed in the first portion 301. In process 401, the first insulating layers 311, 313, and 315 and the wiring layers 312 and 314 constituting the second layered structure 320 may be formed in the second portion 302. In process 401, the first insulating layers 311, 313, and 315 and the wiring layers 312 and 314 may be alternately stacked.

In an embodiment, via holes capable of connecting the wiring layers 312 and 314 positioned in different layers may be formed in the first insulating layers 311, 313, and 315 of the second layered structure 320. For example, a via hole may be formed to penetrate (or by etching) specified portions of the first insulating layers 311, 313, and 315 in the Z-axis direction.

In an embodiment, a conductive line (e.g., the conductive line 351 or 352 of FIG. 3A or the conductive line 353 or 354 of FIG. 3B) may be formed in the via hole. For example, the conductive line may be formed by plating an inner wall of the via hole with metal. The conductive line may electrically connect the wiring layers 312 and 314 positioned in different layers.

Process 402 may be an operation of masking the second portion 302 of the antenna structure 300a or 300b and forming the first layered structure 310 in the first portion 301. In process 402, the rest of the first layered structure 310 may be stacked in a state where the second portion 302 is masked. In process 402, the first insulating layers 317 and 319 and the wiring layers 316 and 318 formed on the first layer 315 may be alternately stacked in the first portion 301. In process 402, the first layered structure 310 may be formed up to the second surface. In process 402, a layered structure of the first insulating layers 317 and 319 and the wiring layers 316 and 318 may not be formed in the second portion 302 covered by the mask for performing the masking.

Process 403 may be an operation of stacking the second insulating layer 330 in the second portion 302 after removing the mask of the antenna structure 300a or 300b according to an embodiment. In process 403, the second insulating layer 330 may be formed in the second portion 302. In process 403, the second insulating layer 330 may be formed up to the second surface.

Process 404 may be an operation of forming a via hole in the second insulating layer 330 of the antenna structure 300a or 300b according to an embodiment and then forming the conductive line 351, 352, 353, or 354 along the via hole. In process 404, a via hole that may be connected with the second insulating layer 330 may be formed in the second insulating layer 330. For example, the via hole may be formed to penetrate (or by etching) a specified portion of the second insulating layer 330 in the Z-axis direction.

Process 405 may be an operation of forming the at least one antenna patch 341, 342, 343, 344, 345, or 346 of the antenna patch 300a or 300b according to an embodiment and attaching the RFIC 360 manufactured separately. In process 405, the RFIC 360 may be attached to the first surface of the antenna structure 300a or 300b. In process 405, the at least one antenna patch 341, 342, 343, 344, 345, or 346 may be formed on the second surface of the antenna structure 300a or 300b. The at least one antenna patch 341, 342, 343, 344, 345, or 346 and the RFIC 360 may be formed with a surface mount device (SMD). The at least one antenna patch 341, 342, 343, 344, 345, or 346 and the RFIC 360 may be electrically connected by using the conductive line 351, 352, 353, or 354.

FIGS. 5A to 5D illustrate diagrams of printed circuit boards of antenna structures 500a to 500d according to an embodiment. The antenna structures 500a to 500d of FIGS. 5A to 5D may perform substantially the same function as any one circuit board of the circuit boards 221 to 224 of FIG. 2. A PCB may have a first layered structure 510 that is formed in a multi-layer stack-up structure. The first layered structure 510 may include wiring layers 512 and 514 and first insulating layers 511 and 513.

In an embodiment, the PCB may transfer an input RF signal to a communication module (e.g., the communication module 190 of FIG. 1) by using at least one RF wiring. The PCB may be provided with an RF signal from at least one antenna (e.g., the antenna patch 341 or 342 of FIG. 3A or the antenna patch 343, 344, 345, or 346 of FIG. 3B). The PCB may transfer the RF signal to an RFIC (e.g., the RFIC 360 of FIG. 3A).

In an embodiment, the at least one antenna may be positioned on one surface of the PCB, and the RFIC may be positioned on an opposite surface of the PCB. For example, the at least one antenna may be positioned on an upper surface of the PCB, and the RFIC may be positioned on a lower surface of the PCB. However, the disclosure is not limited thereto. For example, the PCB may be connected with the RFIC by using a transmission line. The transmission line may transfer an intermediate frequency (IF) signal or transmit and receive RF signals (e.g., a millimeter wave (mmWave) signal).

Figure 5A:
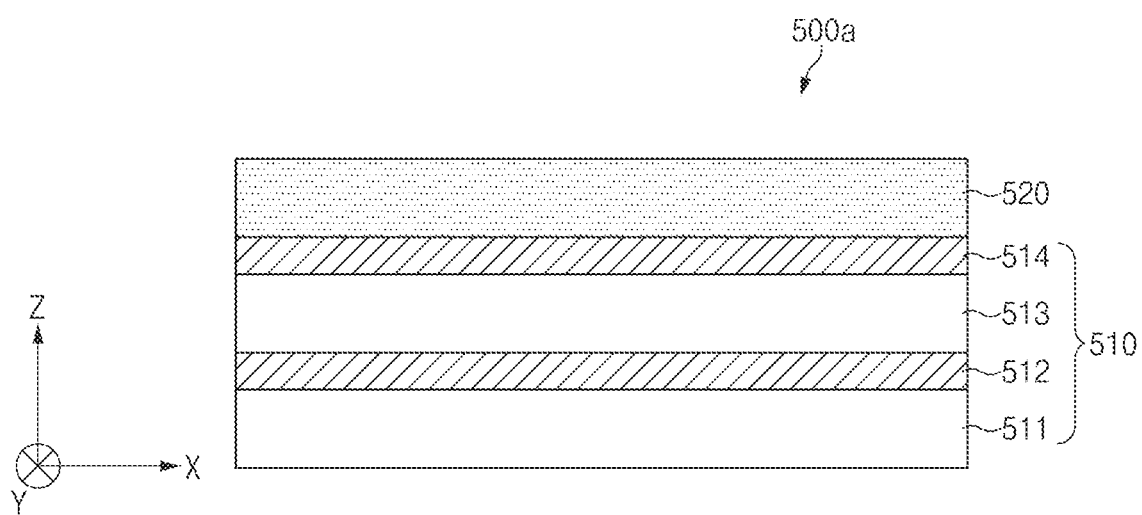
FIGS. 5A to 5D illustrate diagrams of a printed circuit board (PCB) of an antenna structure according to an embodiment.

In an embodiment, as illustrated in FIG. 5A, a second insulating layer 520 may be formed with a single layer on the whole area of the PCB forming the antenna structure 500a. The second insulating layer 520 may be positioned within the first layered structure 510 or may be positioned on one surface of the first layered structure 510. For example, the second insulating layer 520 may be positioned on the first layered structure 510.

Figure 5B:
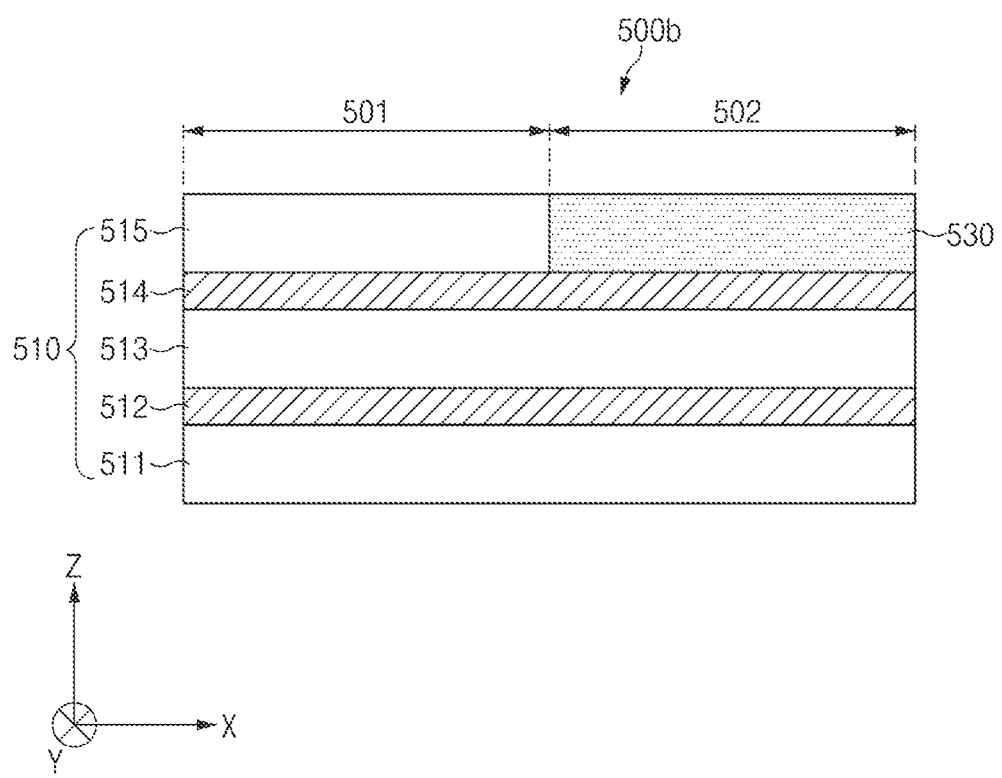

In an embodiment, as illustrated in FIG. 5B, the antenna structure 500b may include a first portion 501 and a second portion 502. The first layered structure 510 in the first portion 501 may be a structure in which first insulating layers 511, 513, and 515 and the wiring layers 512 and 514 are alternately positioned. A second insulating layer 530 may be positioned in the second portion 502. The second insulating layer 530 may be positioned in the same layer as the first insulating layers 511, 513, and 515 of the first layered structure 510. For example, the second insulating layer 530 may be positioned in the same layer as the first insulating layer 515 positioned on the upper side of the first layered structure 510 from among the first insulating layers 511, 513, and 515.

Figure 5C:
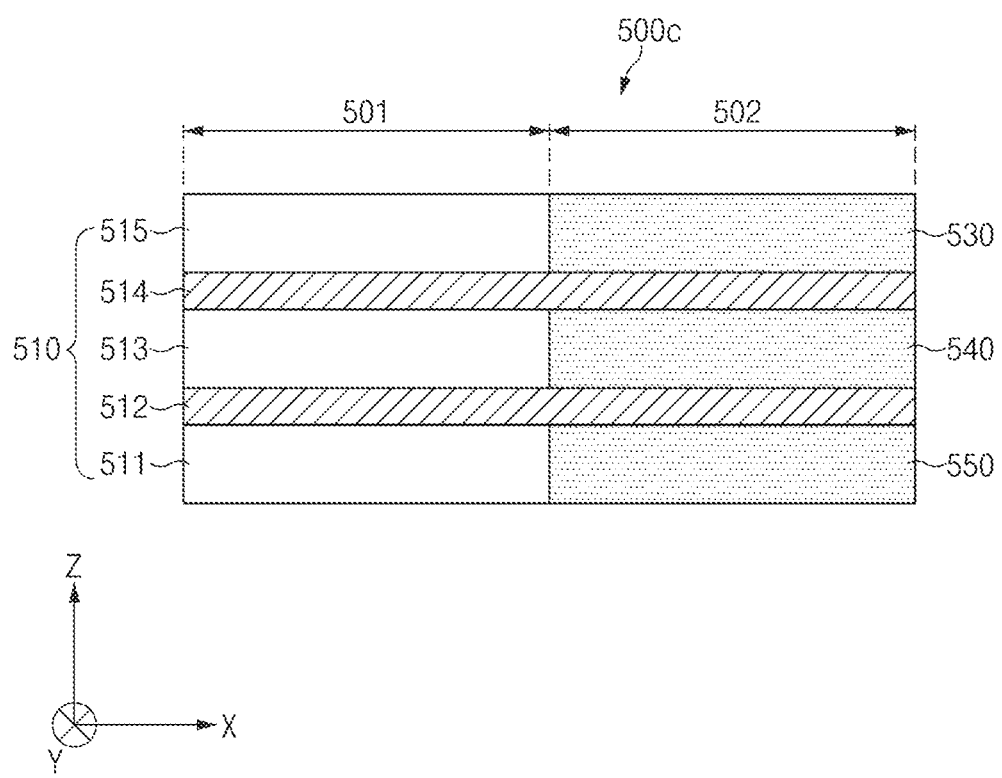

In an embodiment, as illustrated in FIG. 5C, second insulating layers 530, 540, and 550 of the antenna structure 500c may be formed in a multi-layer structure in the second portion 502. The first layered structure 510 may be a structure in which the first insulating layers 511, 513, and 515 and the wiring layers 512 and 514 are alternately positioned. The second insulating layers 530, 540, and 550 may be positioned in the second portion 502. The second insulating layers 530, 540, and 550 may be positioned in the same layers as the first insulating layers 511, 513, and 515 of the first layered structure 510, in a multi-layer structure. For example, all the second insulating layers 530, 540, and 550 may be positioned in the same layers as the first insulating layers 511, 513, and 515 of the first layered structure 510.

In an embodiment, the first loss tangent value that is a loss tangent value of a dielectric material forming the first insulating layers 511, 513, and 515 may be 0.02 or more and 0.03 or less. For example, the first loss tangent value may be about "0.03". The second loss tangent value that is a loss tangent value of a dielectric material forming the second insulating layers 530, 540, and 550 may be 0.001 or more and 0.01 or less. For example, the second loss tangent value may be about "0.002".

In an embodiment, because a tangent function outputs substantially the same value as an input value when a value of 0 or more and 0.03 or less is input, a ratio of a real part to an imaginary part of a complex dielectric constant of each of the dielectric materials forming the first insulating layers 511, 513, and 515 and the second insulating layers 520, 530, 540, and 550 may be easily calculated by using the first loss tangent value and the second loss tangent value. As the real part of the complex dielectric constant of each of the dielectric materials forming the first insulating layers 511, 513, and 515 and the second insulating layers 520, 530, 540, and 550 decreases, the first loss tangent value and the second loss tangent value may increase. In particular, in the case of decreasing a real part of a complex dielectric constant of a dielectric material, a loss of an electrical signal that is transferred through a conductive line adjacent to a dielectric material may decrease.

In an embodiment, a loss tangent value of the second insulating layers 520, 530, 540, and 550 may be smaller than a loss tangent value of the first insulating layers 511, 513, and 515 as much as ⅓₀ times or more and ½ times or less. As such, a loss of an RF signal due to the second insulating layers 520, 530, 540, and 550 may decrease as much as ⅓₀ times or more and ½ times or less.

Figure 5D:
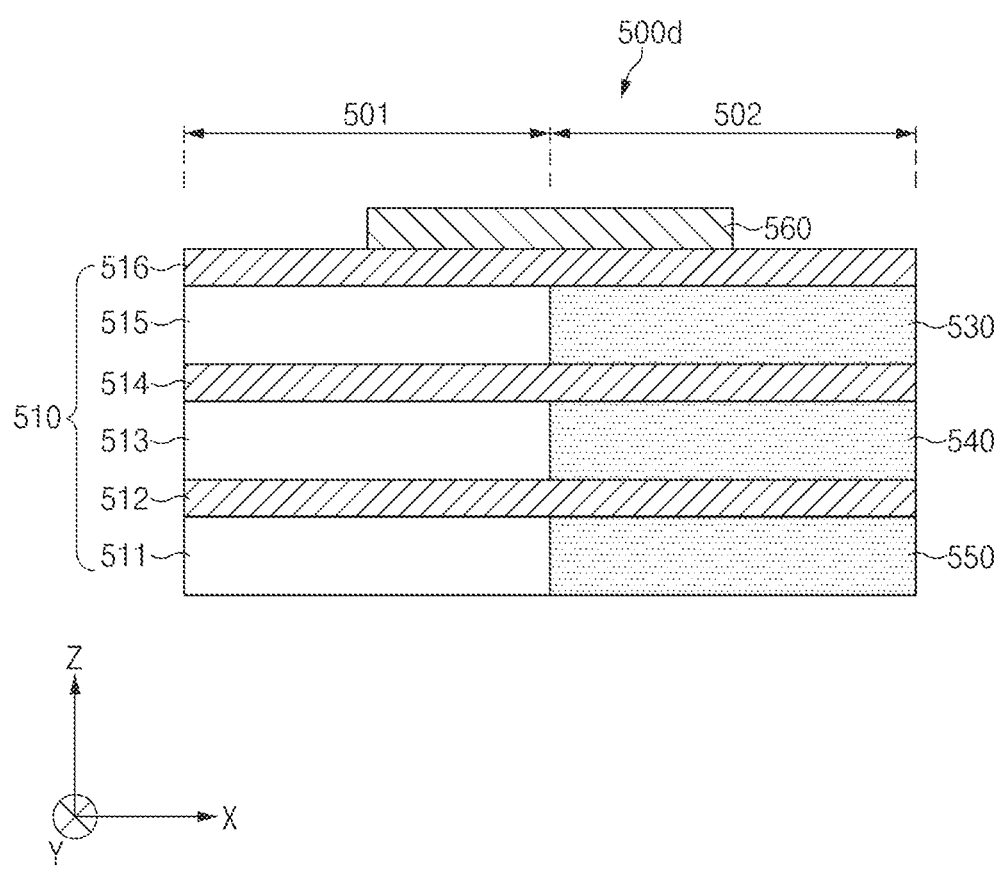

In an embodiment, as illustrated in FIG. 5D, a PCB of the antenna structure 500d may further include a reinforcement member 560 positioned on a boundary line between the first portion 501 and the second portion 502 of the second surface (e.g., the second surface of FIG. 3A). The reinforcement member 560 may at least partially overlap the first portion 501 and the second portion 502. The reinforcement member 560 may be attached to the second surface.

For example, the reinforcement member 560 may be implemented with an SMD and may be attached on the boundary line between the first portion 501 and the second portion 502. A separate uppermost layer 516 may be formed on the PCB for the purpose of attaching a reinforcement member implemented with an SMD. A pad formed of a conductive layer may be provided in the uppermost layer 516 of the PCB.

For another example, the reinforcement member 560 may be attached directly on the PCB. The reinforcement member 560 may be pressed such that the reinforcement member 560 is attached to the second surface of the PCB. In this case, the reinforcement member 560 may include a separate adhesive component for the purpose of fixing the reinforcement member 560 to the second surface of the PCB.

In an embodiment, in the case where the reinforcement member 560 is positioned, a crack of the second surface may be prevented from occurring at the boundary line between the first portion 501 and the second portion 502. Also, in the case where the reinforcement member 560 is positioned, the antenna structure 500d may be prevented from being separated along the boundary line between the first insulating layer 515 and the second insulating layer 530, which are adjacent to the second surface.

According to various embodiments, a first conductive layer (e.g., the wiring layer 514), a second wiring layer (e.g., the wiring layer 512) positioned below the first conductive layer, and an insulating layer between the first conductive layer and the second conductive layer and including a first dielectric (e.g., the first insulating layer 513) having a first dielectric loss and a second dielectric (e.g., the second insulating layer 540) having a second dielectric loss smaller than the first dielectric loss may be formed in a circuit board (e.g., the PCB of the antenna structure 500c or 500d).

Figure 6A:
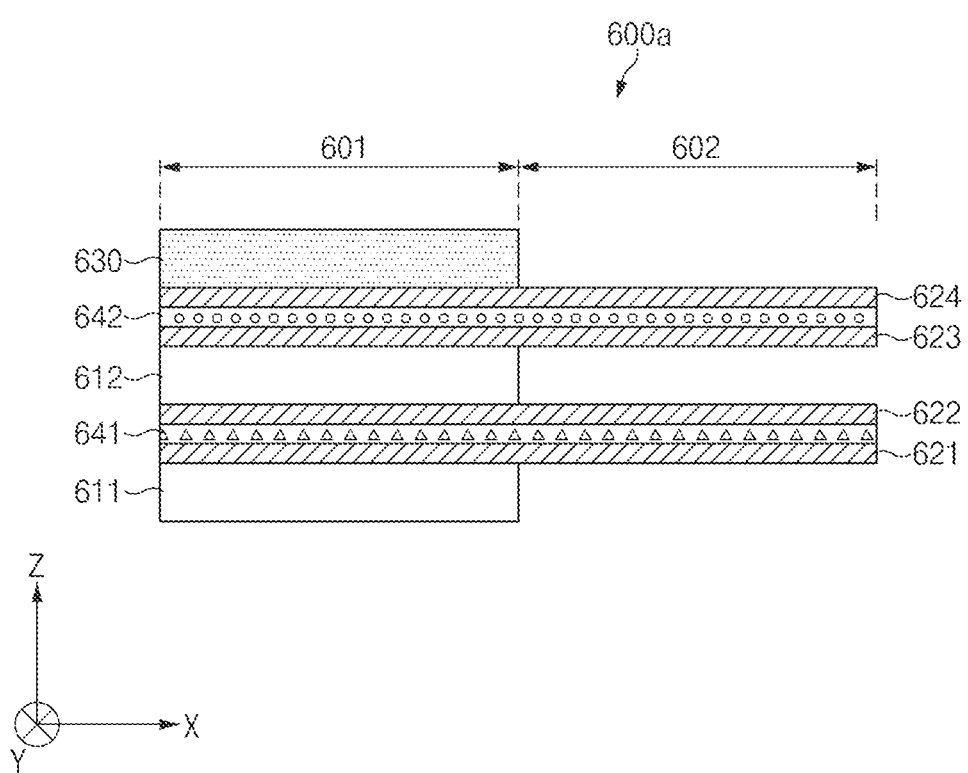
FIGS. 6A and 6B illustrate diagrams of a PCB and a flexible PCB (FPCB) of an antenna structure according to another embodiment.
Figure 6B:
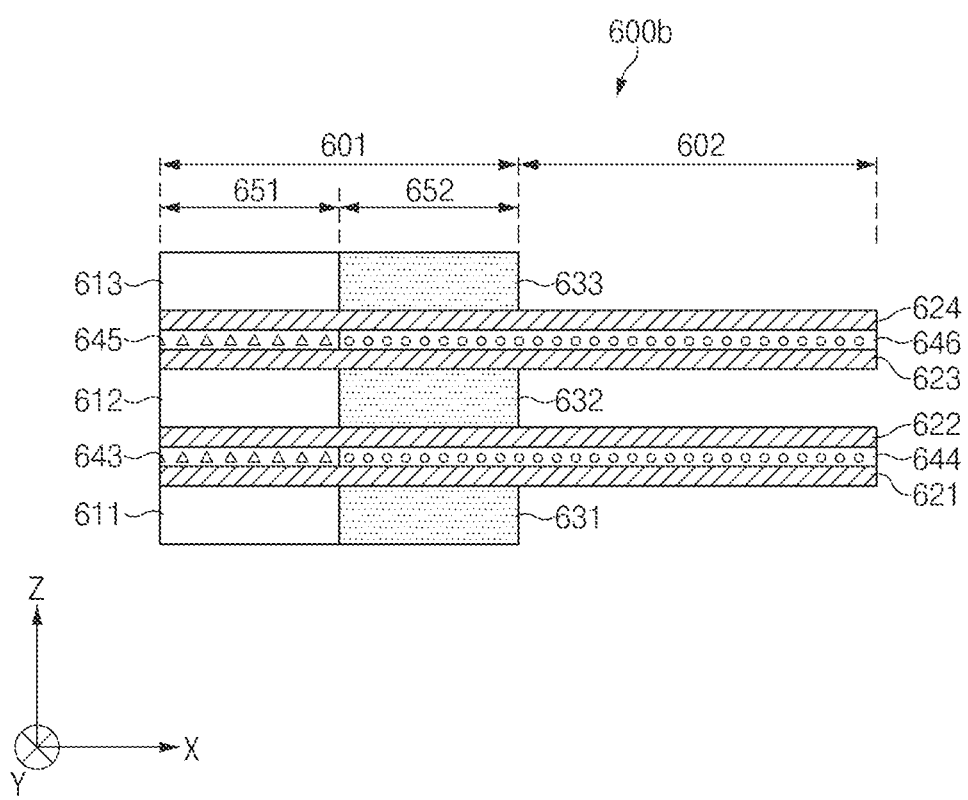

FIGS. 6A and 6B illustrate diagrams of a PCB 601 and an FPCB 602 of each of antenna structures 600a and 600b according to another embodiment. The antenna structures 600a and 600b of FIGS. 6A and 6B may perform substantially the same function as any one circuit board of the circuit boards 221 to 224 of FIG. 2.

In an embodiment, as illustrated in FIG. 6A, the PCB 601 of the antenna structure 600a may include first insulating layers 611 and 612 and a second insulating layer 630 that are formed in a multi-layer stack-up structure. The PCB 601 may include wiring layers 621 to 624 and flexible layers 641 and 642 formed between the first insulating layers 611 and 612 or between the first insulating layer 612 and the second insulating layer 630. The FPCB 602 may include the wiring layers 621 to 624 and the flexible layers 641 and 642.

In an embodiment, as illustrated in FIG. 6B, the PCB 601 of the antenna structure 600b may include first insulating layers 611 to 613 and second insulating layers 631 to 633 that are formed in a multi-layer stack-up structure. The PCB 601 may include the wiring layers 621 to 624 and the flexible layers 643 to 646 formed between the first insulating layers 611 to 613 or between the second insulating layers 631 to 633. The FPCB 602 may include the wiring layers 621 to 624 and the flexible layers 643 to 646.

In an embodiment, as illustrated in FIG. 6A, in the PCB 601, the first insulating layers 611 and 612 may be positioned in lower layers with respect to the Z-axis, and the second insulating layer 630 may be positioned in an upper layer with respect to the Z-axis. As illustrated in FIG. 6B, in the PCB 601, the first insulating layers 611 to 613 may be positioned in a first portion 651 (e.g., the first portion 301 of FIG. 3A), and the second insulating layers 631 to 633 may be positioned in a second portion 652 (e.g., the second portion 302 of FIG. 3A). The PCB 601 may maintain a specified shape by the first insulating layers 611 to 613 and the second insulating layers 630 to 633.

In an embodiment, by using the wiring layers 621 to 624, the PCB 601 may be provided with an RF signal from the FPCB 602 or may transfer an RF signal thereto. The FPCB 602 may be electrically connected with an RFIC (e.g., the RFIC 360 of FIG. 3A). For example, the FPCB 602 may be connected with one side of the RFIC, or the RFIC may be mounted on the FPCB 602.

In an embodiment, the flexible layers 641 to 646 may be positioned between the wiring layers 621 to 624. The flexible layers 641 to 646 may have a given elastic force. For example, the flexible layers 641 to 646 may be formed of polyimide. The flexible layers 641 to 646 may allow the FPCB 602 to have flexibility. The flexible layers 641 to 646 may include the first flexible layers 641, 643, and 645 and the second flexible layers 642, 644, and 646.

In an embodiment, the first flexible layers 641, 643, and 645 may have the first loss tangent value. The second flexible layers 642, 644, and 646 may have the second loss tangent value. The second loss tangent value may be smaller than the first loss tangent value. The second flexible layers 642, 644, and 646 may decrease a loss of an RF signal occurring in the wiring layers 621 to 624, more than the first flexible layers 641, 643, and 645.

In an embodiment, as illustrated in FIG. 6A, the second flexible layer 642 may be formed with a single layer included in the PCB 601 and the FPCB 602. For example, in the case where the RFIC or an RF wiring transferring an RF signal is positioned in the wiring layers 623 and 624 positioned on the upper side with respect to the Z-axis, the second flexible layer 642 may be formed with a single layer on the upper side with respect to the Z-axis, and may be positioned adjacent to the second insulating layer 630.

In an embodiment, as illustrated in FIG. 6B, the second flexible layers 644 and 646 may be formed in a multi-layer structure in the second portion 652 of the PCB 601 and the FPCB 602. For example, in the case where the RFIC is positioned in the FPCB 602, for the purpose of improving a loss characteristic of the FPCB 602, the second flexible layers 644 and 646 may be formed adjacent to all the wiring layers 621 to 624.

In an embodiment, in the case where the FPCB 602 is connected with the RFIC, wirings for transferring various signals to the RFIC may be formed on the FPCB 602.

According to various embodiments, an antenna structure 600a or 600b may include a communication circuit (e.g., the communication circuit 231, 232, 233, or 234 of FIG. 2) and a circuit board (e.g., the circuit board 221, 222, 223, or 224 of FIG. 2). The circuit board may include a first conductive layer (e.g., 624 of FIG. 6A or 6B), a second conductive layer (e.g., 623 of FIG. 6A or 6B) positioned below the first conductive layer, a first insulating layer (e.g., 645 of FIG. 6B) between the first conductive layer and the second conductive layer and including a first dielectric having a first dielectric loss, wherein at least one antenna and the communication circuit electrically connected with the antenna through at least one wiring are positioned in a specified area, a third conductive layer (e.g., 622 of FIG. 6A or 6B) positioned below the second conductive layer, and a second insulating layer (e.g., 632 of FIG. 6A or 6B) between the second conductive layer and the third conductive layer and in the specified area and including a second dielectric having a second dielectric loss smaller than the first dielectric loss.

Figure 7:
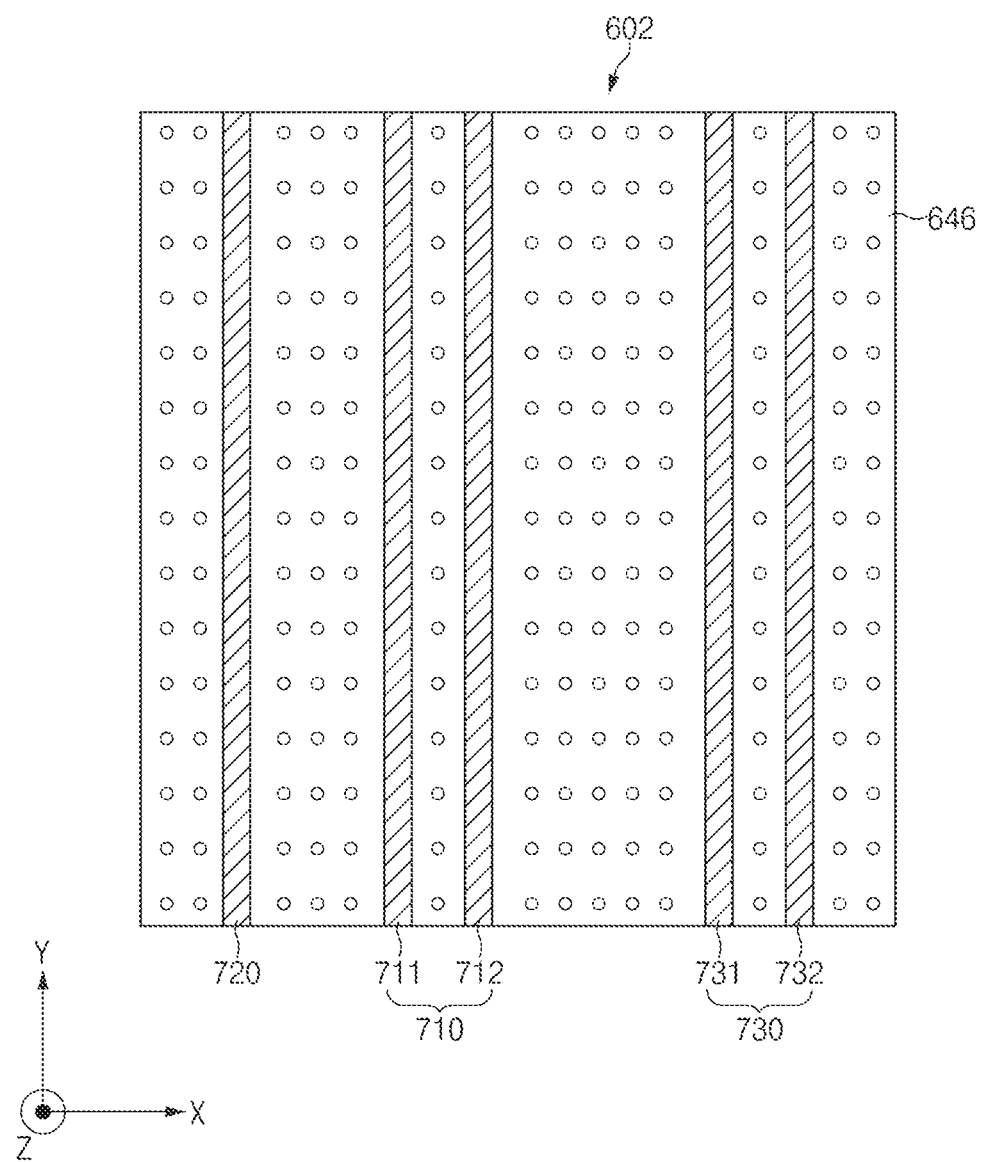
FIG. 7 illustrates a diagram of an FPCB according to an embodiment.

FIG. 7 illustrates a diagram of the FPCB 602 according to an embodiment. The FPCB 602 may include an RF wiring 710, a ground wiring 720, and a base band (BB) wiring 730.

In an embodiment, the RF wiring 710 may include one or more conductive lines 711 and 712. The RF wiring 710 may be formed in a wiring layer (e.g., the wiring layer 624 positioned on the upper side with respect to the Z-axis of FIG. 6A). The RF wiring 710 may be connected with an RFIC (e.g., the RFIC 360 of FIG. 3A) and may transfer an RF signal.

In an embodiment, the ground wiring 720 may include one or more ground lines. The ground wiring 720 may be spaced from the RF wiring 710. For example, the ground wiring 720 may be positioned on one side or opposite sides of the RF wiring 710 with respect to the X-axis. The ground wiring 720 may set a ground voltage of the FPCB 602.

In an embodiment, the BB wiring 730 may include one or more conductive lines 731 and 732. The BB wiring 730 may be spaced from the RF wiring 710 and the ground wiring 720. For example, the BB wiring 730 may be positioned on one side of the RF wiring 710 and the ground wiring 720 with respect to the X-axis. The BB wiring 730 may transfer signals in a baseband.

In an embodiment, one surface of the second flexible layer 646 may be in contact with the RF wiring 710. The second flexible layer 646 may be in contact with one surface of the wiring layer 624. As such, the second flexible layer 646 may be in contact with the RF wiring 710 forming the wiring layer 624. In the case where the second flexible layer 646, the loss tangent value of which is smaller than that of the first flexible layer 645, is in contact with the RF wiring 710, a loss of an RF signal that is transferred in the RF wiring 710 may decrease.

In an embodiment, the ground wiring 720 and the BB wiring 730 may be in contact with the second flexible layer 646. The ground wiring 720 and the BB wiring 730 may be positioned in the same layer as the RF wiring 710. As such, the second flexible layer 646 may be in contact with the ground wiring 720 and the BB wiring 730 forming the wiring layer 624. In the case where the second flexible layer 646, the loss tangent value of which is smaller than that of the first flexible layer 645, is in contact with the ground wiring 720 and the BB wiring 730, a loss of signals in the baseband that are transferred through the BB wiring 730 and a loss of a ground voltage that is transferred through the ground wiring 720 may decrease.

Figure 8:
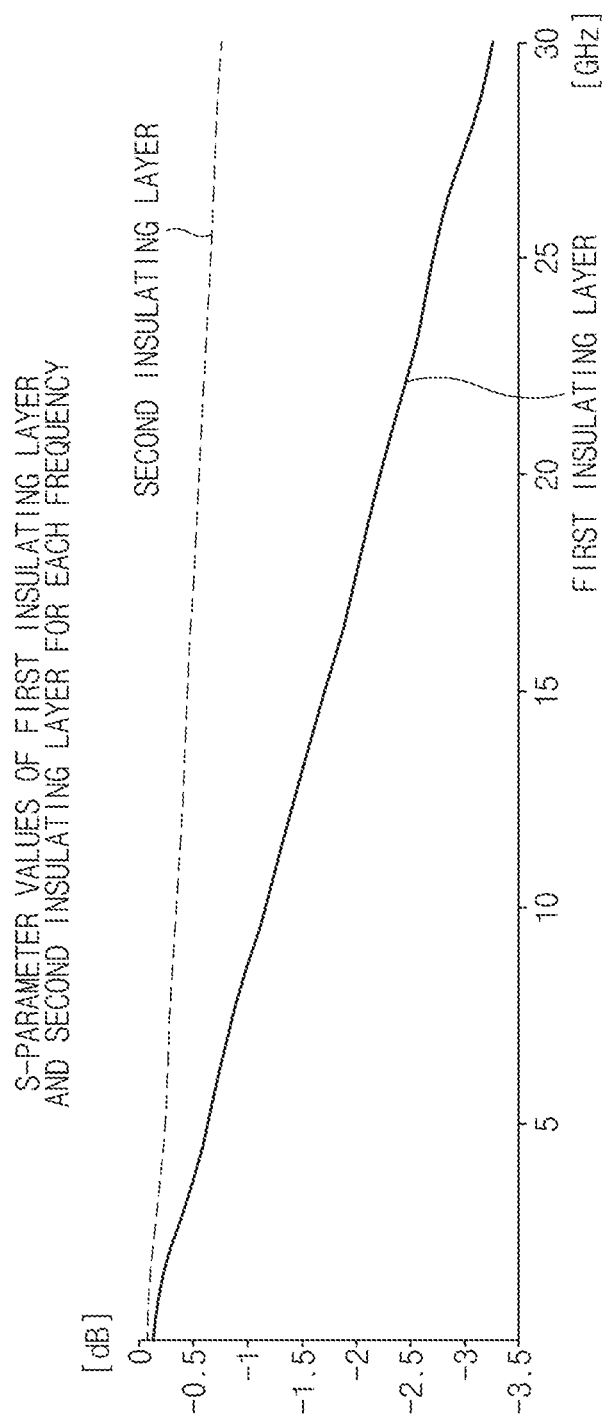
FIG. 8 illustrates a graph of S-parameters of a first insulating layer and a second insulating layer for each frequency, according to an embodiment.

FIG. 8 illustrates a graph of S-parameters of a first insulating layer and a second insulating layer for each frequency, according to an embodiment.

In an embodiment, as a frequency increases, an S-parameter value of the first insulating layer may decrease. At a frequency of about 28 GHz, the S-parameter value may be about −3 dB. In the case where the S-parameter value is about −3 dB, the strength of a signal input to an input part may be 0.7 times greater than the strength of a signal output to an output part. As such, in the first insulating layer, at a frequency of about 28 GHz or higher, the amount of signal lost may be 0.3 times or greater of the amount of input signal. In the case where the first insulating layer is used to transmit/receive an RF signal using a frequency of about 28 GHz or higher, a loss of a signal may increase, and power consumption may increase.

In an embodiment, as a frequency increases, an S-parameter value of the second insulating layer may decrease less than the first insulating layer. At a frequency of about 28 GHz, the S-parameter value may be about −0.7 dB. In the case where the S-parameter value is about −0.7 dB, the magnitude of a voltage input to an input part may be about 0.92 times greater than the magnitude of a voltage output to an output part. In the case where the second insulating layer 330 is used, only about 8% of an input signal may be lost at the frequency of about 28 GHz. In the case where the second insulating layer 330 is used to transmit/receive an RF signal using a frequency of about 28 GHz or higher, a loss of a signal may decrease, and power consumption may decrease.

Figure 9A:
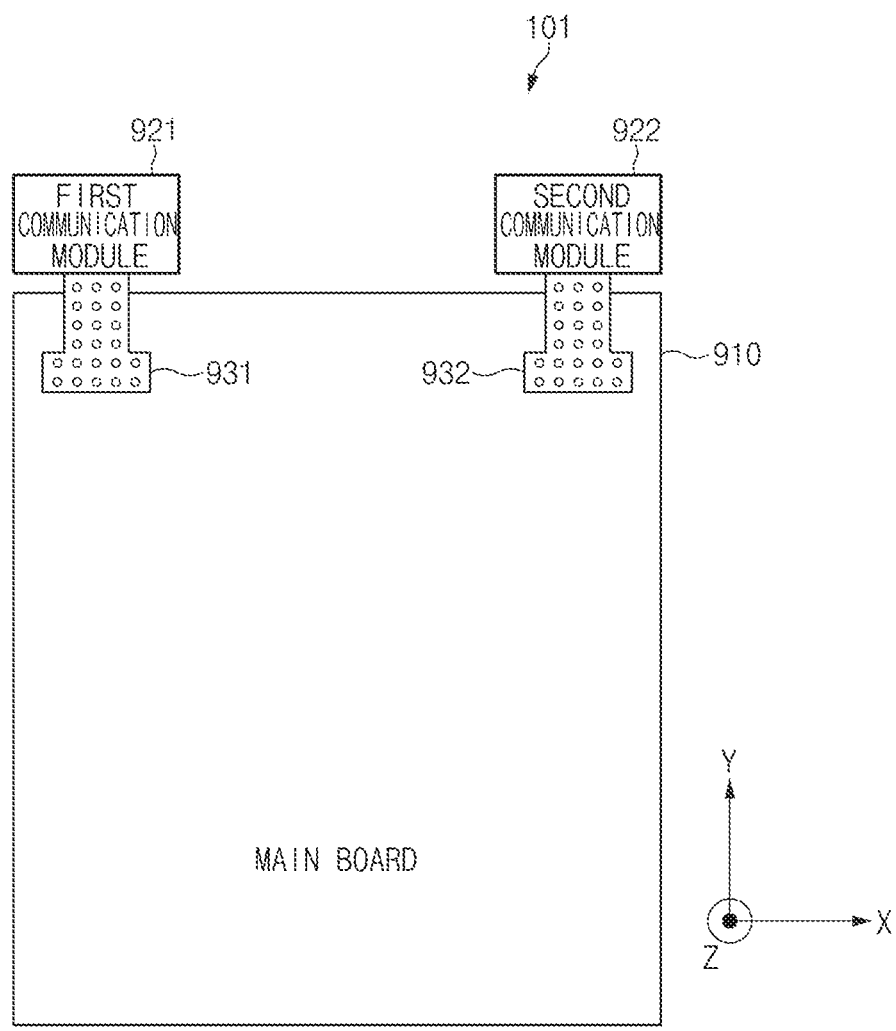
FIG. 9A illustrates a diagram of an electronic device including a main board, communication modules, and FPCBs according to another embodiment.

FIG. 9A illustrates a diagram of the electronic device 101 including a main board 910, communication modules 921 and 922, and FPCBs 931 and 932 according to an embodiment.

In an embodiment, the main board 910 may drive the electronic device 101 and may generate an RF signal that the electronic device 101 will output. The main board 910 may be formed of a PCB. The main board 910 may include a plurality of wiring layers and a plurality of insulating layers. The main board 910 may include a processor (e.g., the processor 120 of FIG. 1). The main board 910 may transfer an RF signal to the communication modules 921 and 922 by using the processor.

In an embodiment, the communication modules 921 and 922 may include the first and second communication modules 921 and 922. The first and second communication modules 921 and 922 may be spaced from the main board 910. The first and second communication modules 921 and 922 may be provided with an RF signal from the main board 910.

In an embodiment, the FPCBs 931 and 932 may connect the main board 910 and the communication modules 921 and 922. The FPCBs 931 and 932 may include the first and second FPCBs 931 and 932. The first FPCB 931 may transfer an RF signal from the main board 910 to the first communication module 921. The second FPCB 932 may transfer an RF signal from the main board 910 to the second communication module 922.

In an embodiment, each of the first and second FPCBs 931 and 932 may include at least a portion of a second flexible layer (e.g., the second insulating layer 642 of FIG. 6A) having the second loss tangent value. The first and second FPCBs 931 and 932 may have a loss tangent value that is smaller than a loss tangent value of a dielectric forming an insulating layer of the main board 910. As such, the first and second FPCBs 931 and 932 may decrease a loss of an RF signal between the main board 910 and the communication modules 921 and 922, thus minimizing the attenuation of the RF signal.

Figure 9B:
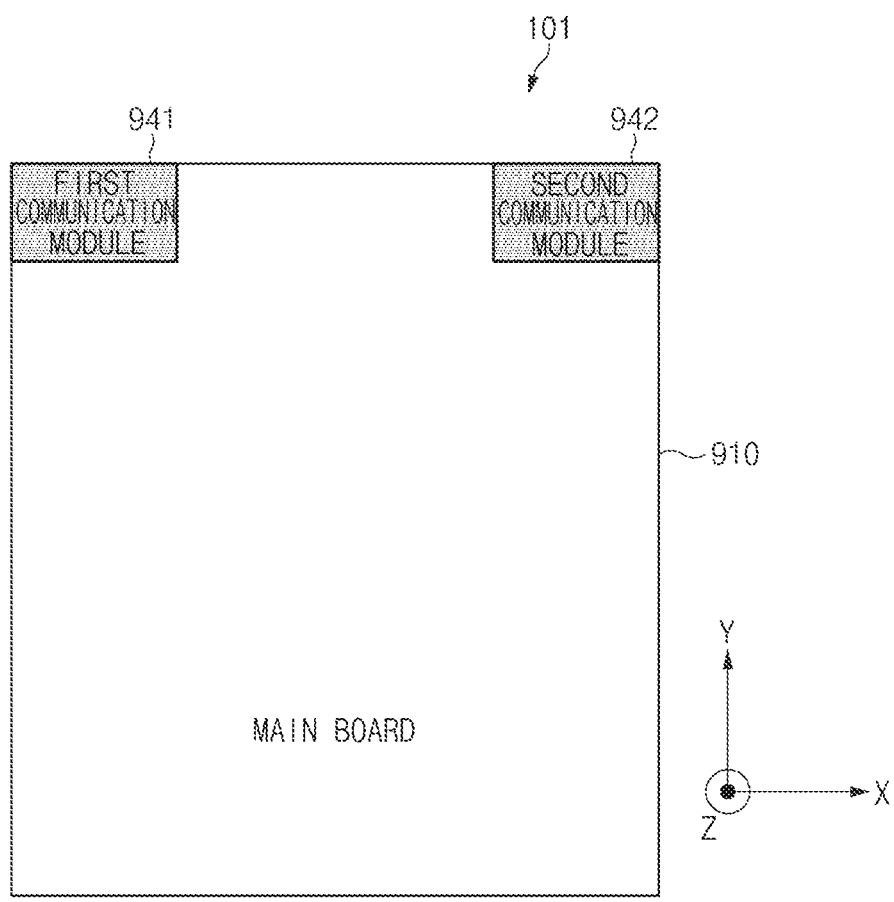
FIG. 9B illustrates a diagram of an electronic device including a main board and communication modules according to another embodiment.

FIG. 9B illustrates a diagram of the electronic device 101 including the main board 910 and communication modules 941 and 942 according to another embodiment.

In an embodiment, the first and second communication modules 941 and 942 included in the communication modules 941 and 942 may be positioned within the main board 910. The first and second communication modules 941 and 942 may be provided with an RF signal from the main board 910.

In an embodiment, each of the first and second communication modules 941 and 942 may include at least a portion of a second insulating layer (e.g., the second insulating layer 330 of FIG. 3A) having the second loss tangent value. The first and second communication modules 941 and 942 may have a loss tangent value that is smaller than a loss tangent value of a dielectric forming an insulating layer of the main board 910. As such, the first and second communication modules 941 and 942 may decrease a loss of an RF signal occurring upon receiving the RF signal from the main board 910, thus minimizing the attenuation of the RF signal.

Figure 10:
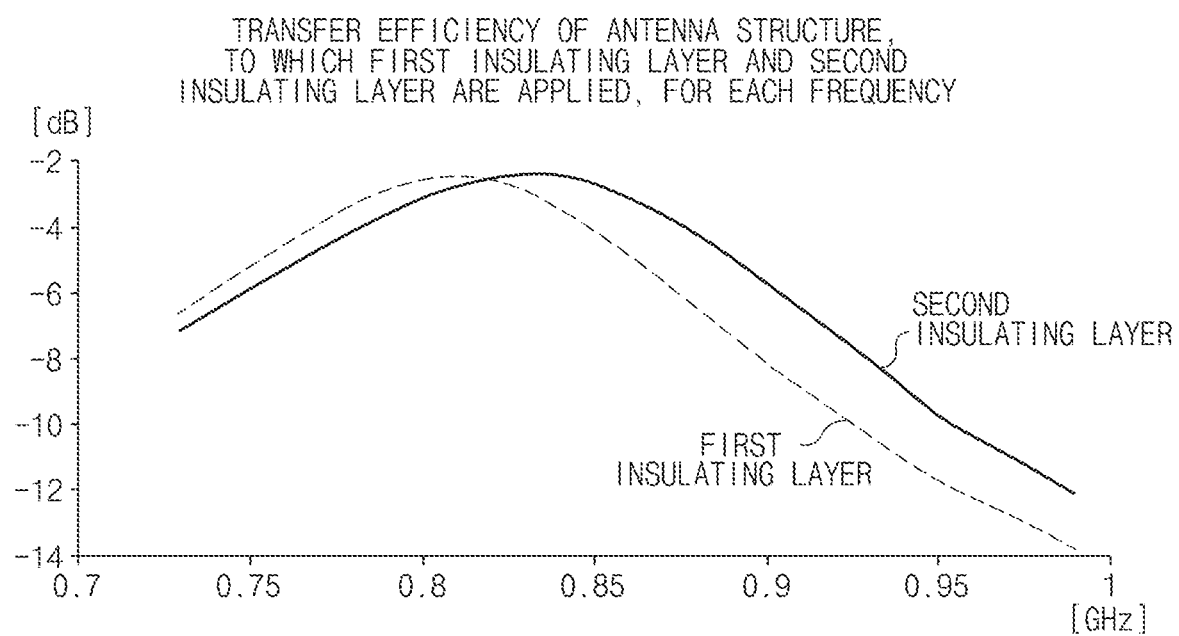
FIG. 10 illustrates a graph of efficiency of an antenna structure, to which a first insulating layer and a second insulating layer are applied, for each frequency, according to an embodiment.

FIG. 10 illustrates a graph of transfer efficiency of an antenna structure, to which a first insulating layer and a second insulating layer are applied, for each frequency, according to an embodiment. The transfer efficiency may be defined as a ratio of an output signal to an input signal.

In an embodiment, an antenna structure to which the first insulating layer is applied may have the maximum transfer efficiency at a frequency of about 0.8 GHz. In the antenna structure to which the first insulating layer is applied, as a frequency increases within a frequency range of about 0.85 GHz or higher, the transfer efficiency may decrease. At a frequency of about 0.89 GHz, the transfer efficiency may be about −7.3 dB. When the transfer efficiency is about −7.3 dB, most of a signal may be blocked. As such, the antenna structure to which the first insulating layer is applied may be inappropriate to transmit/receive a signal of about 0.89 GHz.

In an embodiment, an antenna structure to which the second insulating layer is applied may have the maximum transfer efficiency at a frequency of about 0.85 GHz. In the antenna structure to which the second insulating layer is applied, as a frequency increases within a frequency range of about 0.85 GHz or higher, the transfer efficiency may decrease less than in the antenna structure to which the first insulating layer is applied. At a frequency of about 0.89 GHz, the S-parameter value may be about −4.9 dB. When the S-parameter value is about −4.9 dB, most of a signal may be transferred. As such, the antenna structure to which the second insulating layer is applied may be appropriate to transmit/receive a signal of about 0.89 GHz.

In an embodiment, compared with the case where the first insulating layer is applied, it is observed the following in the case where the second insulating layer is applied: a loss of a signal decreases, and the transfer efficiency increases. As such, the disclosure is not limited to an embodiment where the second insulating layer is applied to the inside of an antenna structure of an electronic device, and the second insulating layer may be applied to the outside of the antenna structure or any component except for the antenna structure.

Figure 11:
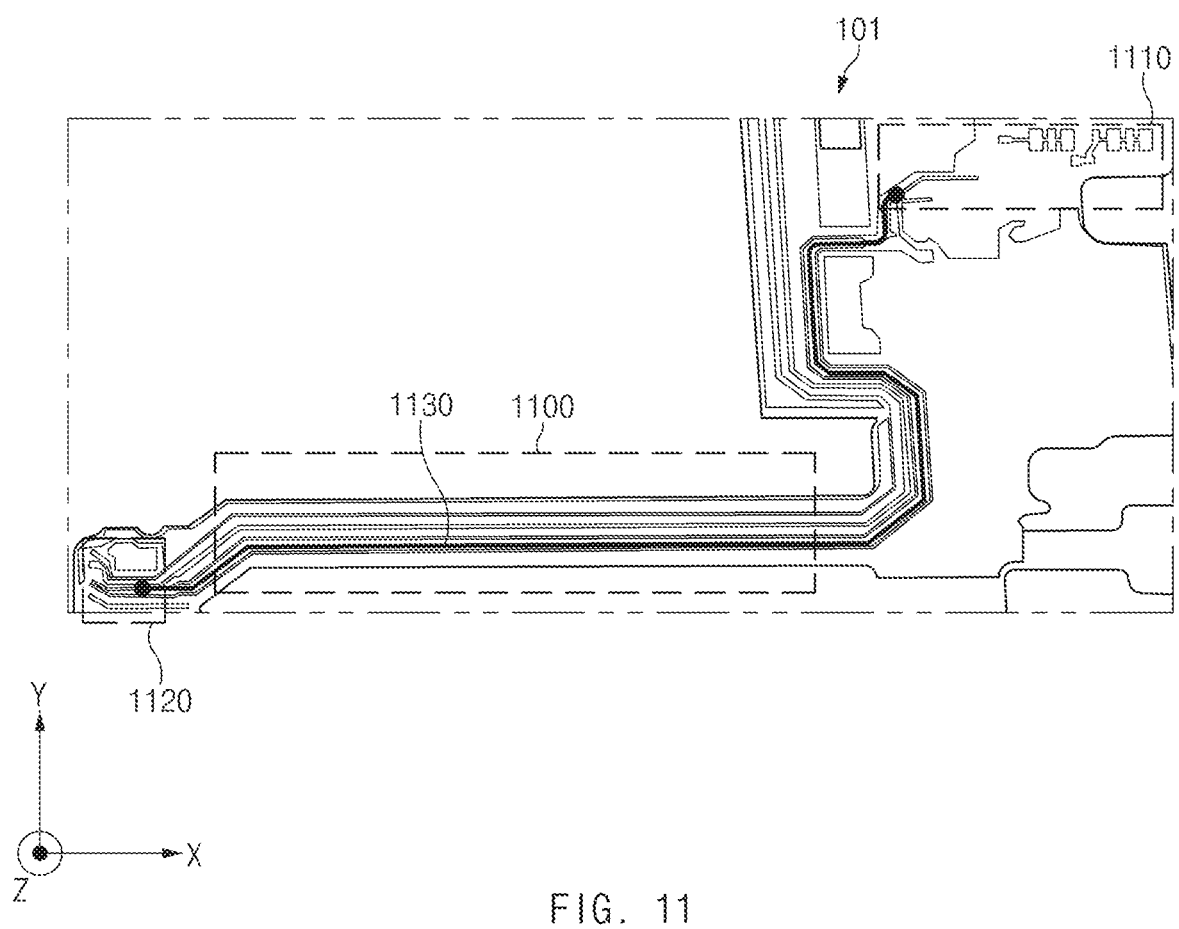
FIG. 11 illustrates a diagram of an antenna clip, an inter frequency integrated circuit (IFIC), and a connection wiring of an RF wiring section of an electronic device according to an embodiment.

FIG. 11 illustrates a diagram of an antenna clip 1110, an inter frequency integrated circuit (IFIC) 1120, and a connection wiring 1130 of an RF wiring section 1100 of the electronic device 101 according to an embodiment.

In an embodiment, the antenna clip 1110 may be a portion of an area where an antenna structure is positioned. The connection wiring 1130 of the RF wiring section 1100 may be connected with one side of the antenna clip 1110. The antenna clip 1110 may output an RF signal to the connection wiring 1130.

In an embodiment, the IFIC 1120 may up-convert or down-convert a frequency. For example, the IFIC 1120 may up-convert an intermediate frequency (IF) signal to an RF signal of a millimeter wave (mmWave). The IFIC 1120 may transfer the up-converted RF signal to the antenna clip 1110 through the connection wiring 1130. For another example, the IFIC 1120 may down-convert an RF signal of a millimeter wave to an IF signal. The IFIC 1120 may transfer the down-converted IF signal to a baseband modem.

In an embodiment, the RF wiring section 1100 may be interposed between the antenna clip 1110 and the IFIC 1020. The RF wiring section 1100 may be provided at an edge of one side of the electronic device 101. The RF wiring section 1100 may include the connection wiring 1130.

In an embodiment, the connection wiring 1130 may connect the antenna clip 1110 and the IFIC 1120. The connection wiring 1130 may transfer an RF signal from the antenna clip 1110 to the IFIC 1120. The connection wiring 1130 may transfer an RF signal from the IFIC 1120 to the antenna clip 1110.

Figure 12:
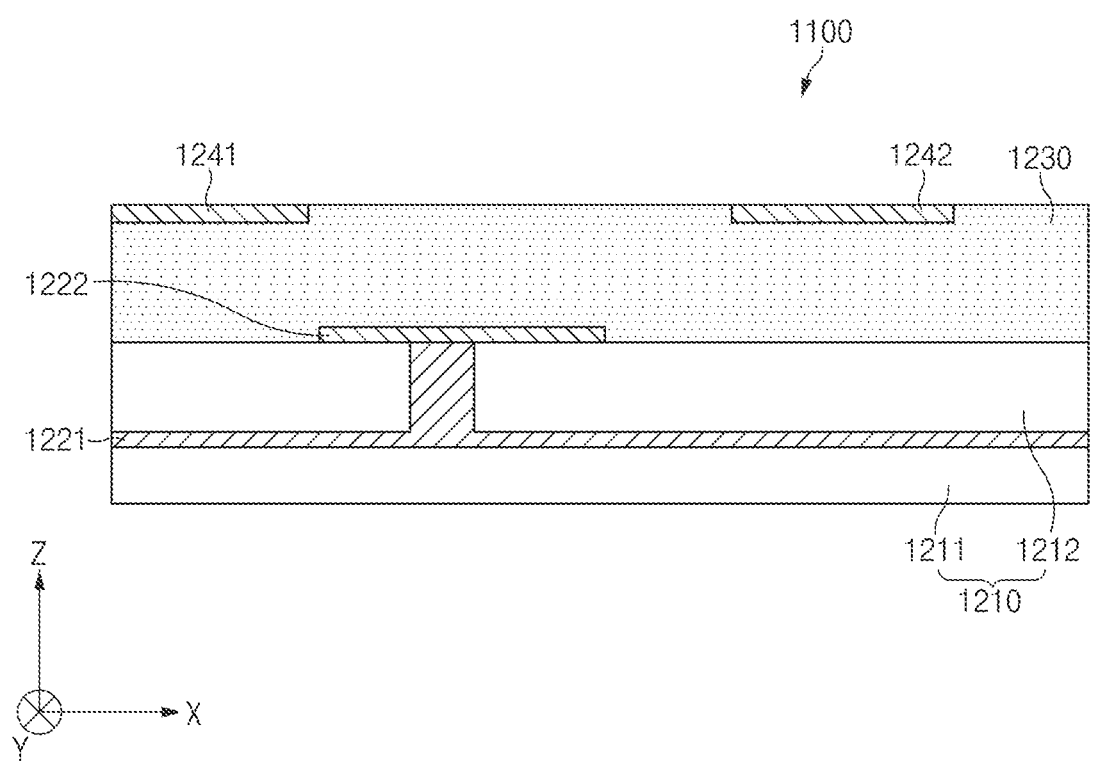
FIG. 12 illustrates a diagram of an RF wiring section according to an embodiment.

FIG. 12 illustrates a diagram 1100 of the RF wiring section 1100 according to an embodiment. The RF wiring section 1100 may include a first insulating layer 1210, RF ground wirings 1221 and 1222, a second insulating layer 1230, and connection wirings 1241 and 1242.

In an embodiment, the first insulating layer 1210 may include a plurality of layers 1211 and 1212. For example, the first insulating layer 1210 may include the lower layer 1211 and the upper layer 1212 with respect to the RF ground wiring 1221. The first insulating layer 1210 may protect the RF ground wirings 1221 and 1222 from a shock and may prevent the RF ground wirings 1221 and 1222 from being detached to the lower side with respect to the Z-axis. The first insulating layer 1210 may have the first tangent value.

In an embodiment, the RF ground wirings 1221 and 1222 may be positioned in a boundary layer between the first insulating layer 1210 and the second insulating layer 1230. The RF ground wirings 1221 and 1222 may be connected to each other. The RF ground wirings 1221 and 1222 may set a ground voltage of the RF wiring section 1100.

In an embodiment, the second insulating layer 1230 may be positioned on the first insulating layer 1210. The second insulating layer 1230 may be interposed between the RF ground wirings 1221 and 1222 and the connection wirings 1241 and 1242. The second insulating layer 1230 may separate the RF ground wirings 1221 and 1222 from the connection wirings 1241 and 1242. The second insulating layer 1230 may have the second loss tangent value.

In an embodiment, the connection wirings 1241 and 1242 may be positioned on one surface of the second insulating layer 1230. For example, the connection wirings 1241 and 1242 may be positioned on an upper surface of the second insulating layer 1230 with respect to the Z-axis. The connection wirings 1241 and 1242 may connect an antenna (e.g., the antenna clip 1110 of FIG. 11) and a communication module (e.g., the IFIC 1120 of FIG. 11).

In an embodiment, the RF ground wirings 1221 and 1222 that are spaced from the connection wirings 1241 and 1242 may be further positioned. For example, the RF ground wirings 1221 and 1222 may be positioned on the lower side of the connection wirings 1241 and 1242 with respect to the Z-axis.

In an embodiment, the first insulating layer 1210 having the first loss tangent value may be positioned under the RF ground wiring 1222, and the second insulating layer 1230 having the second loss tangent value smaller than the first loss tangent value may be interposed between the connection wirings 1241 and 1242 and the RF ground wiring 1222. As such, a loss of an RF signal that is transferred by using the connection wirings 1241 and 1242 may decrease.

Figure 13:
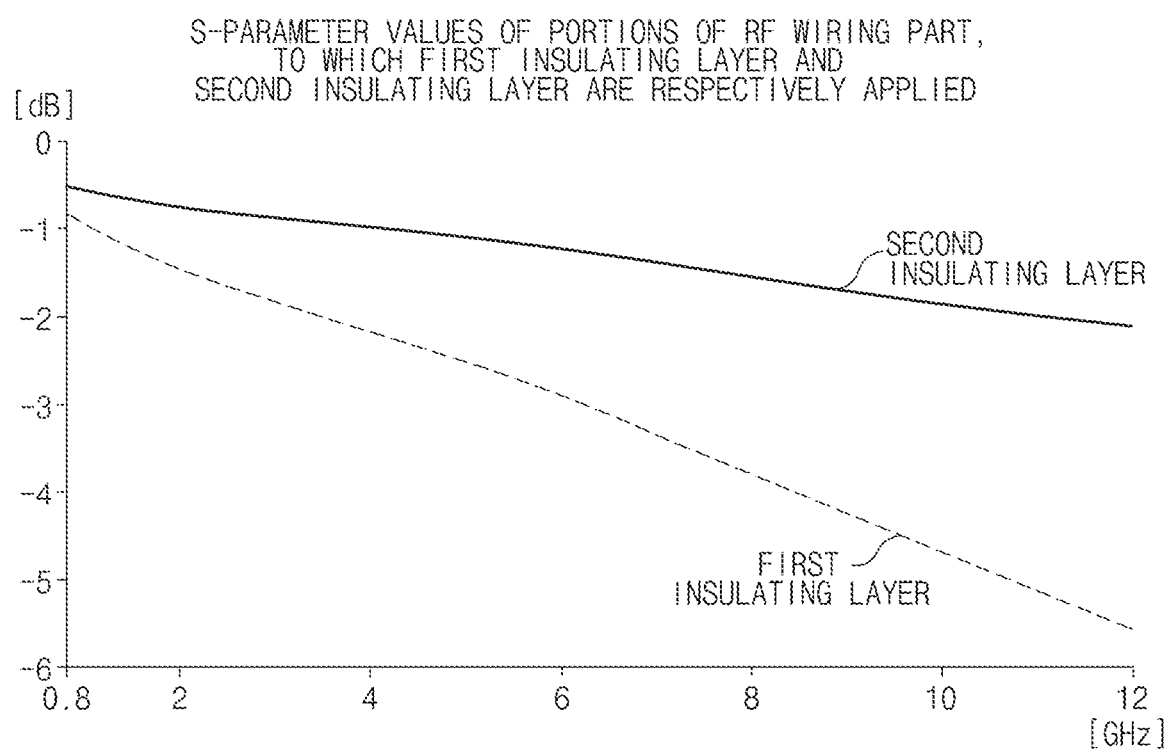
FIG. 13 illustrates a graph of an S-parameter of an RF wiring section, to which a first insulating layer and a second insulating layer are applied, for each frequency, according to an embodiment.

FIG. 13 illustrates a graph of an S-parameter value of an RF wiring section (e.g., the RF wiring section 1100 of FIG. 11), to which a first insulating layer (e.g., the first insulating layer 1210 of FIG. 12) and a second insulating layer (e.g., the second insulating layer 1230 of FIG. 12) are applied, for each frequency, according to an embodiment.

In an embodiment, as a frequency increases, an S-parameter value of the first insulating layer may decrease. At a frequency of about 10 GHz, the S-parameter value may be about −4.7 dB. It is observed that a loss of an RF signal transferred in the RF wiring section is great in the case where the S-parameter value is about −4.7 dB. As such, in the case where the first insulating layer is used to transmit/receive an RF signal using a frequency of about 10 GHz or higher, power consumption may increase.

In an embodiment, as a frequency increases, an S-parameter value of the second insulating layer may decrease less than the first insulating layer. At a frequency of about 10 GHz, the S-parameter value may be about −1.8 dB. It is observed that a loss of an RF signal transferred in the RF wiring section is small in the case where the S-parameter value is about −1.8 dB. As such, in the case where the second insulating layer is used to transmit/receive an RF signal using a frequency of about 10 GHz or higher, power consumption may decrease.

Figure 14:
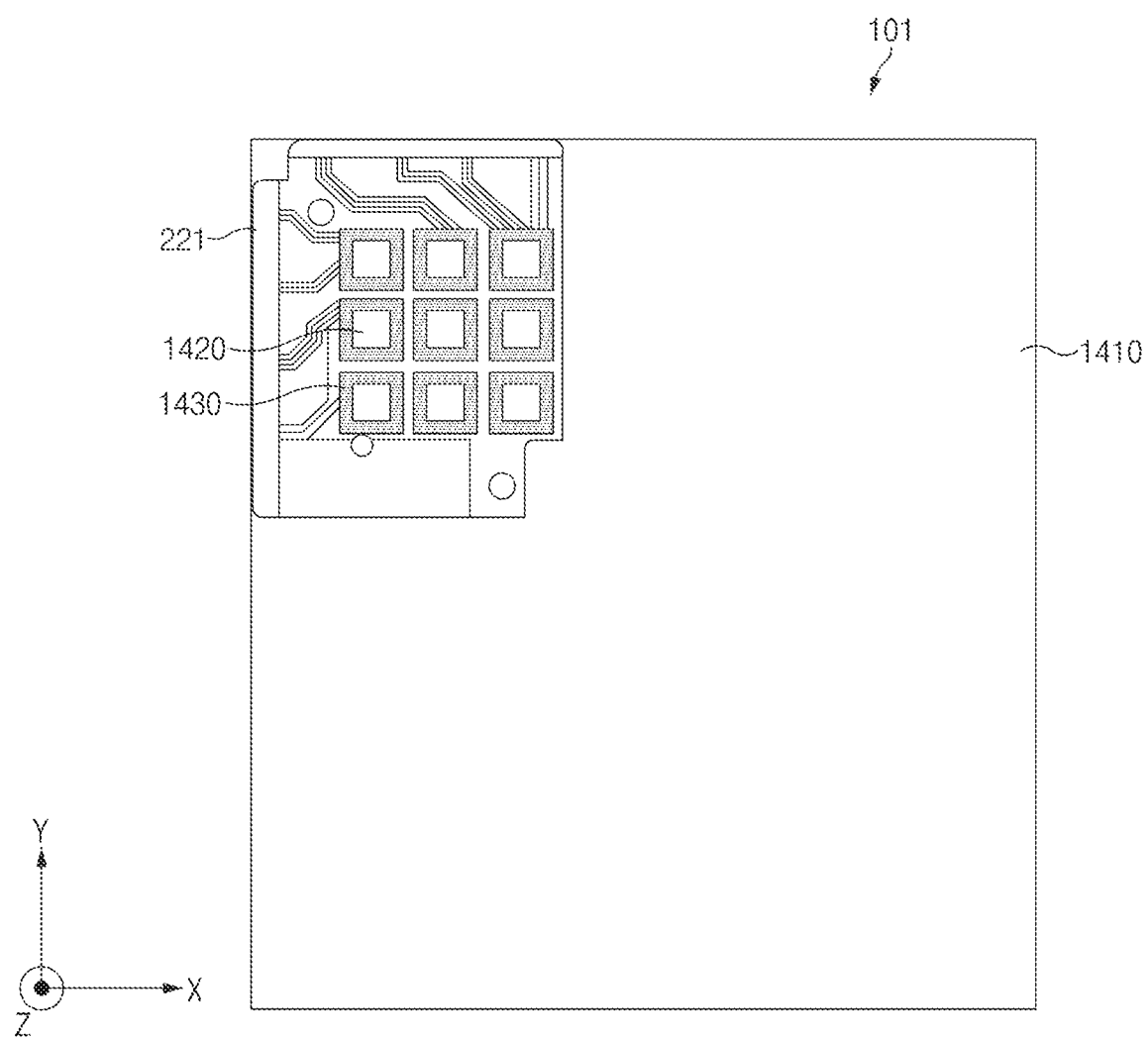
FIG. 14 illustrates a diagram of a structure in which a second insulating layer is applied to a circuit board of an electronic device according to an embodiment.

FIG. 14 illustrates a diagram of a structure in which a second insulating layer 1430 is applied to the circuit board 221 of the electronic device 101 according to an embodiment.

In an embodiment, the circuit board 221 may be positioned adjacent to an edge of one side of the electronic device 101. For example, the circuit board 221 may be positioned adjacent to a corner of one side of the electronic device 101. The circuit board 221 may include at least one or more antenna patches 1420.

In an embodiment, a first insulating layer 1410 may be applied to the remaining area of the electronic device 101 other than the circuit board 221. For example, the first insulating layer 1410 may be applied when a PCB and an FPCB of an area of the electronic device 101, in which an antenna is not positioned, are designed. The first insulating layer 1410 may separate wiring layers of the PCB and the FPCB.

In an embodiment, the second insulating layer 1430 may be included in the circuit board 221. For example, the second insulating layer 1430 may respectively separate the at least one or more antenna patches 1420 of the circuit board 221 and may be positioned under the at least one or more antenna patches 1420. The second insulating layer 1430 has a lower loss tangent value and a lower dielectric loss than the first insulating layer 1410. As such, in the case where the circuit board 221 includes the second insulating layer 1430, a loss of an RF signal occurring in the circuit board 221 may decrease.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to an embodiment of the disclosure, in the case of decreasing a loss tangent value of an insulating layer, a loss of an RF signal occurring in the insulating layer may decrease. As such, the loss of the RF signal may decrease in an antenna structure, and thus making it possible to transmit the RF signal efficiently.

Also, in the case of applying a dielectric having a low loss tangent value to an antenna structure, a PCB, or an FPCB, the attenuation of signal in the antenna structure, the PCB, or the FPCB may be minimized. In particular, as a frequency band used in an antenna structure of an electronic device increases, a ratio in which a loss characteristic of an RF signal is improved may increase. As such, the antenna structure may be used in a high frequency band, and the width of the frequency band of the antenna structure may increase.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a communication circuit; and
a circuit board including a first surface and a second surface facing away from the first surface, wherein the circuit board includes:
a first portion including a first layered structure in which part of a plurality of wiring layers and part of a plurality of first insulating layers are alternately positioned from the first surface to the second surface;
a second portion including:
a second layered structure in which another part of the plurality of wiring layers and another part of the plurality of first insulating layers are alternately positioned from the first surface to a first layer provided between the first surface and the second surface, and
a second insulating layer positioned on the first layer up to the second surface and forming a portion of the second surface;
at least one antenna patch positioned on the second insulating layer or within the second insulating layer; and
a conductive line penetrating the second layered structure and at least a portion of the second insulating layer and electrically connecting the at least one antenna patch and the communication circuit,
wherein the communication circuit is disposed on the first surface, and
wherein the plurality of first insulating layers have a first loss tangent value, and the second insulating layer has a second loss tangent value smaller than the first loss tangent value.

2. The electronic device of claim 1, wherein:
the first loss tangent value is 0.02 or more and 0.03 or less; and
the second loss tangent value is 0.001 or more and 0.01 or less.

3. The electronic device of claim 1, wherein a structure of the first layered structure from the first surface to the first layer and the second layered structure have a same stacked structure.

4. The electronic device of claim 1, wherein the conductive line penetrates the plurality of first insulating layers of the second layered structure and is connected with the plurality of wiring layers of the second layered structure.

5. The electronic device of claim 1, wherein the second insulating layer is formed with a single layer from an upper surface of the second layered structure to a lower surface of the at least one antenna patch.

6. The electronic device of claim 5, wherein the conductive line is connected with the lower surface of the at least one antenna patch.

7. The electronic device of claim 1, wherein the at least one antenna patch includes:
a first antenna patch positioned on at least a portion of a surface of the second insulating layer; and
a second antenna patch positioned within the second insulating layer.

8. The electronic device of claim 7, wherein the conductive line is connected with a lower surface of the second antenna patch.

9. The electronic device of claim 1, further comprising:
a reinforcement member positioned on a boundary line of the second surface between the first portion and the second portion.

10. An antenna structure comprising:
a communication circuit; and
a circuit board including a first surface and a second surface facing away from the first surface, wherein the circuit board includes:
a plurality of first conductive layers,
a second conductive layer positioned below the first conductive layer, a plurality of first insulating layers, wherein each of the plurality of first conductive layers and the plurality of first insulating layers are alternatively positioned from the first surface to a first layer provided between the first surface and the second surface, wherein the first insulating layer forms a first dielectric having a first dielectric loss, at least one antenna electrically connected to the communication circuit through at least one wiring, wherein the at least one antenna is positioned in a specified area, a third conductive layer positioned below the second conductive layer, and a second insulating layer positioned between the second conductive layer and the third conductive layer and in the specified area, wherein the second insulating layer forms a second dielectric having a second dielectric loss smaller than the first dielectric loss, wherein the communication circuit is disposed on the first surface.

11. The antenna structure of claim 10, wherein the first dielectric is formed in an area other than the specified area.

12. The antenna structure of claim 10, wherein the at least one wiring penetrates at least a portion of the plurality of first insulating layers and at least a portion of the second insulating layer by using at least one via hole.

13. The antenna structure of claim 10, wherein the second insulating layer is formed in the specified area in a stacked structure.

14. The antenna structure of claim 10, wherein the second insulating layer is formed with a single layer in a whole area between the second conductive layer and the third conductive layer.

15. The antenna structure of claim 10, wherein a height of an upper surface of the second insulating layer is equal to or less than a height of an upper surface of a first layered structure.

* * * * *